(12) United States Patent
Lemke et al.

(10) Patent No.: US 8,167,630 B2
(45) Date of Patent: *May 1, 2012

(54) HIGH DENSITY CONNECTOR AND METHOD OF MANUFACTURE

(75) Inventors: Timothy A. Lemke, Dillsburg, PA (US); Timothy W. Houtz, Etters, PA (US)

(73) Assignee: FCI Americas Technology LLC, Carson City, NV (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/891,469

(22) Filed: Sep. 27, 2010

(65) Prior Publication Data

US 2011/0076897 A1    Mar. 31, 2011

Related U.S. Application Data

(60) Continuation of application No. 12/352,227, filed on Jan. 12, 2009, now Pat. No. 7,802,999, which is a continuation of application No. 11/668,435, filed on Jan. 29, 2007, now Pat. No. 7,476,110, which is a continuation of application No. 11/272,212, filed on Nov. 10, 2005, now Pat. No. 7,168,964, which is a division of application No. 09/953,631, filed on Sep. 14, 2001, now Pat. No. 7,186,123, which is a continuation of application No. 09/284,230, filed as application No. PCT/US97/18354 on Oct. 10, 1997, now Pat. No. 6,325,644, and a continuation of application No. 08/728,194, filed on Oct. 10, 1996, now Pat. No. 6,024,584, and a continuation of application No. 08/777,579, filed on Dec. 31, 1996, now Pat. No. 6,164,983, and a continuation of application No. 08/777,806, filed on Dec. 31, 1996, now Pat. No. 6,358,068, and a continuation of application No. 08/778,380, filed on Dec. 31, 1996, now Pat. No. 6,079,991, and a continuation of application No. 08/778,398, filed on Dec. 31, 1996, now Pat. No. 6,093,035.

(51) Int. Cl.
*H01R 9/09* (2006.01)
(52) U.S. Cl. .......................................... 439/83; 439/876
(58) Field of Classification Search ................... 439/83, 439/876
See application file for complete search history.

(56) References Cited

U.S. PATENT DOCUMENTS 614,839 A    11/1898    Cleveland
(Continued)

FOREIGN PATENT DOCUMENTS
EP    0 591 772    4/1994
(Continued)

OTHER PUBLICATIONS

EIAJ Re-5200, Dec. 1993.
(Continued)

*Primary Examiner* — Gary F. Paumen
(74) *Attorney, Agent, or Firm* — Dean E. Geibel; M. Richard Page

(57) ABSTRACT

Electrical connectors capable of being mounted on circuit substrates by BGA techniques are disclosed. Also disclosed is a method for manufacturing such connectors. There is at least one recess on the exterior side of the connector elements. A conductive contact extends from adjacent the interior side of the into the recess on the exterior side of the housing. A controlled volume of solder paste is introduced into the recess. A fusible conductive element, in the form of solder balls is positioned in the recess. The connector is subjected to a reflow process to fuse the solder ball to the portion of the contact extending into said recess. Contacts are secured in the insulative housing of the connector by deformable sections that minimize stress imposed on the housing, thereby reducing warpage. Solder resist areas are formed on central portions of the contacts to promote uniformity of solder volume. As a result of these features, substantial coplanarity of the BGA array along the mounting interface of the connector is achieved.

4 Claims, 28 Drawing Sheets

U.S. PATENT DOCUMENTS

| | | |
|---|---|---|
| 1,757,695 A | 5/1930 | Westly |
| 2,289,512 A | 7/1942 | McKenney |
| 2,364,124 A | 12/1944 | Bolles |
| 2,385,915 A | 10/1945 | Hagedorn |
| 2,699,527 A | 1/1955 | Kamowski |
| 2,702,255 A | 2/1955 | Yager |
| 2,740,075 A | 3/1956 | Walker et al. |
| 2,794,176 A | 5/1957 | Barnes |
| 2,879,977 A | 3/1959 | N.J. Trought |
| 2,938,068 A | 5/1960 | Silverschotz |
| 2,980,881 A | 4/1961 | McKee |
| 3,020,650 A | 2/1962 | Hawkins |
| 3,022,481 A | 2/1962 | Stepoway |
| 3,130,351 A | 4/1964 | Giel |
| 3,172,718 A | 3/1965 | Lalonde |
| 3,173,737 A | 3/1965 | Kinkaid et al. |
| 3,243,211 A | 3/1966 | Westmore |
| 3,249,910 A | 5/1966 | Venn et al. |
| 3,283,291 A | 11/1966 | Krol et al. |
| 3,289,148 A | 11/1966 | Antes |
| 3,293,590 A | 12/1966 | Woolsey, Jr. |
| 3,320,658 A | 5/1967 | Bolda et al. |
| 3,383,648 A | 5/1968 | Tems |
| 3,399,372 A | 8/1968 | Uberbacher |
| 3,417,362 A | 12/1968 | Reynolds |
| 3,431,541 A | 3/1969 | DeVito |
| 3,464,054 A | 8/1969 | Mansfield |
| 3,504,330 A | 3/1970 | Holzhaeuser |
| 3,518,610 A | 6/1970 | Goodman, et al. |
| 3,526,869 A | 9/1970 | Conrad et al. |
| 3,530,422 A | 9/1970 | Goodman |
| 3,553,630 A | 1/1971 | Scheingold et al. |
| 3,621,444 A | 11/1971 | Stein |
| 3,665,375 A | 5/1972 | Thoms et al. |
| 3,673,548 A | 6/1972 | Mattingly, Jr. et al. |
| 3,681,738 A | 8/1972 | Friend |
| 3,683,317 A | 8/1972 | Walkup |
| 3,719,981 A | 3/1973 | Steitz |
| 3,732,525 A | 5/1973 | Henschen et al. |
| 3,737,838 A | 6/1973 | Mattingly, Jr. et al. |
| 3,742,430 A | 6/1973 | Cairns et al. |
| 3,780,433 A | 12/1973 | Lynch |
| 3,797,108 A | 3/1974 | Healy et al. |
| 3,826,000 A | 7/1974 | DuRocher |
| 3,838,382 A | 9/1974 | Sugar |
| 3,864,004 A | 2/1975 | Friend |
| 3,865,462 A | 2/1975 | Cobaugh et al. |
| 3,866,999 A | 2/1975 | Doherty, Jr. |
| 3,868,166 A | 2/1975 | Ammon |
| 3,889,364 A | 6/1975 | Krueger |
| 3,899,234 A | 8/1975 | Yeager et al. |
| 3,971,610 A | 7/1976 | Buchoff et al. |
| 3,975,076 A | 8/1976 | Shida et al. |
| 3,989,331 A | 11/1976 | Hanlon |
| 3,989,344 A | 11/1976 | Pechard et al. |
| 3,999,955 A | 12/1976 | Martin et al. |
| 4,004,195 A | 1/1977 | Harayda et al. |
| 4,019,803 A | 4/1977 | Schell |
| 4,034,469 A | 7/1977 | Koopman |
| 4,037,270 A | 7/1977 | Ahmann et al. |
| 4,045,114 A | 8/1977 | Dechelette |
| 4,045,868 A | 9/1977 | Ammon et al. |
| 4,047,782 A | 9/1977 | Yeager |
| 4,056,302 A | 11/1977 | Braun et al. |
| 4,077,692 A | 3/1978 | Ellis et al. |
| 4,077,694 A | 3/1978 | Cobaugh et al. |
| 4,085,998 A | 4/1978 | Owens |
| 4,094,564 A | 6/1978 | Cacolici |
| 4,095,866 A | 6/1978 | Merrill |
| 4,097,266 A | 6/1978 | Takahashi et al. |
| 4,106,841 A | 8/1978 | Vladic |
| 4,119,818 A | 10/1978 | Noschese |
| 4,133,592 A | 1/1979 | Cobaugh et al. |
| 4,140,361 A | 2/1979 | Socher |
| 4,159,861 A | 7/1979 | Anhalt |
| 4,165,909 A | 8/1979 | Yeager et al. |
| 4,166,667 A | 9/1979 | Griffin |
| 4,179,177 A | 12/1979 | Lapraik |
| 4,184,735 A | 1/1980 | Ammon et al. |
| 4,189,204 A | 2/1980 | Brown |
| 4,226,496 A | 10/1980 | Langham |
| 4,242,790 A | 1/1981 | Ellingson |
| 4,251,852 A | 2/1981 | Ecker et al. |
| 4,274,700 A | 6/1981 | Keglewitsch et al. |
| 4,298,237 A | 11/1981 | Griffith et al. |
| 4,303,294 A | 12/1981 | Hamsher, Jr. et al. |
| 4,338,652 A | 7/1982 | Romanczuk et al. |
| 4,342,068 A | 7/1982 | Kling |
| 4,343,523 A | 8/1982 | Cairns et al. |
| 4,380,518 A | 4/1983 | Wydro |
| 4,394,530 A | 7/1983 | Kaufman |
| 4,395,086 A | 7/1983 | Marsh |
| 4,396,140 A | 8/1983 | Jaffe et al. |
| 4,396,935 A | 8/1983 | Schuck |
| 4,397,086 A | 8/1983 | Bickos et al. |
| 4,403,819 A | 9/1983 | Weber |
| 4,427,249 A | 1/1984 | Bright et al. |
| 4,431,252 A | 2/1984 | Cairns et al. |
| 4,441,118 A | 4/1984 | Fister et al. |
| 4,442,938 A | 4/1984 | Murphy |
| 4,447,109 A | 5/1984 | Hobart, Jr. |
| 4,462,534 A | 7/1984 | Bitaillou et al. |
| 4,463,060 A | 7/1984 | Updegraff |
| 4,482,937 A | 11/1984 | Berg |
| 4,487,468 A | 12/1984 | Fedder et al. |
| 4,498,725 A | 2/1985 | Bright et al. |
| 4,502,745 A | 3/1985 | Chavers et al. |
| 4,519,658 A | 5/1985 | Biswas |
| 4,537,461 A | 8/1985 | Ouellette |
| 4,539,621 A | 9/1985 | Currier |
| 4,546,542 A | 10/1985 | Proud |
| 4,556,268 A | 12/1985 | Noschese |
| 4,560,221 A | 12/1985 | Olsson |
| 4,561,712 A | 12/1985 | Borne et al. |
| 4,570,338 A | 2/1986 | Ignatowicz |
| 4,585,291 A | 4/1986 | Noschese |
| 4,592,137 A | 6/1986 | Tanaka et al. |
| 4,605,278 A | 8/1986 | Seidler |
| 4,616,895 A | 10/1986 | Yoshizaki et al. |
| 4,621,880 A | 11/1986 | Rush |
| 4,623,208 A | 11/1986 | Kerul et al. |
| 4,637,542 A | 1/1987 | Breske et al. |
| 4,641,426 A | 2/1987 | Hartman et al. |
| 4,645,279 A | 2/1987 | Grabbe et al. |
| 4,654,502 A | 3/1987 | Furtek |
| 4,661,375 A | 4/1987 | Thomas |
| 4,664,309 A | 5/1987 | Allen et al. |
| 4,669,796 A | 6/1987 | Carter |
| 4,671,590 A | 6/1987 | Ignasiak |
| 4,671,592 A | 6/1987 | Ignasiak et al. |
| 4,678,250 A | 7/1987 | Romine et al. |
| 4,678,255 A | 7/1987 | Carter |
| 4,679,889 A | 7/1987 | Seidler |
| 4,684,194 A | 8/1987 | Jenkins et al. |
| 4,691,975 A | 9/1987 | Fukunaga et al. |
| 4,693,528 A | 9/1987 | Asick et al. |
| 4,705,205 A | 11/1987 | Allen et al. |
| 4,705,338 A | 11/1987 | Sitzler |
| 4,715,823 A | 12/1987 | Ezura et al. |
| 4,717,354 A | 1/1988 | McCleerey |
| 4,718,857 A | 1/1988 | Noschese |
| 4,718,863 A | 1/1988 | Sadigh-Behzadi |
| 4,720,156 A | 1/1988 | Beers |
| 4,722,470 A | 2/1988 | Johary |
| 4,726,793 A | 2/1988 | Bright |
| 4,728,305 A | 3/1988 | Seidler |
| 4,734,057 A | 3/1988 | Noschese |
| 4,734,060 A | 3/1988 | Kawawada et al. |
| 4,739,447 A | 4/1988 | Lecomte |
| 4,740,180 A | 4/1988 | Harwath et al. |
| 4,750,266 A | 6/1988 | Brandeau |
| 4,750,889 A | 6/1988 | Ignasiak et al. |
| 4,750,890 A | 6/1988 | Dube et al. |
| 4,759,491 A | 7/1988 | Fisher |
| 4,762,500 A | 8/1988 | Dola et al. |
| 4,767,344 A | 8/1988 | Noschese |
| 4,767,356 A | 8/1988 | Grappe |

| Patent | Date | Inventor |
|---|---|---|
| 4,768,972 A | 9/1988 | Ignasiak et al. |
| 4,769,557 A | 9/1988 | Houf et al. |
| 4,799,897 A | 1/1989 | Mogi et al. |
| 4,801,273 A | 1/1989 | Ikeya et al. |
| 4,802,532 A | 2/1989 | Dawes et al. |
| 4,802,862 A | 2/1989 | Seidler |
| 4,806,103 A | 2/1989 | Kniese et al. |
| 4,808,119 A | 2/1989 | Pfaff |
| 4,824,389 A | 4/1989 | Doyle et al. |
| 4,829,818 A | 5/1989 | Bohrer |
| 4,830,264 A | 5/1989 | Bitaillou |
| 4,836,792 A | 6/1989 | Glover |
| 4,840,305 A | 6/1989 | Ankrom et al. |
| 4,842,538 A | 6/1989 | Noschese |
| 4,843,313 A | 6/1989 | Walton |
| 4,846,734 A | 7/1989 | Lytle |
| 4,854,882 A | 8/1989 | Corridori |
| 4,869,672 A | 9/1989 | Andrews Jr. |
| 4,871,110 A | 10/1989 | Fukasawa et al. |
| 4,871,315 A | 10/1989 | Noschese |
| 4,872,850 A | 10/1989 | Mogi et al. |
| 4,881,908 A | 11/1989 | Perry et al. |
| 4,884,335 A | 12/1989 | McCoy et al. |
| 4,886,470 A | 12/1989 | Billman et al. |
| 4,887,347 A | 12/1989 | Hikita |
| 4,889,500 A | 12/1989 | Lazar et al. |
| 4,892,487 A | 1/1990 | Dranchak et al. |
| 4,893,172 A | 1/1990 | Matsumoto et al. |
| 4,897,918 A | 2/1990 | Osaka et al. |
| 4,900,261 A | 2/1990 | Gentry et al. |
| 4,900,279 A | 2/1990 | Dennis |
| 4,911,643 A | 3/1990 | Perry et al. |
| 4,912,841 A | 4/1990 | Noschese |
| 4,916,523 A | 4/1990 | Sokolovsky et al. |
| 4,932,883 A | 6/1990 | Hsia et al. |
| 4,934,967 A | 6/1990 | Marks et al. |
| 4,934,968 A | 6/1990 | Davis et al. |
| 4,939,529 A | 7/1990 | Kanayama et al. |
| 4,941,833 A | 7/1990 | Noschese et al. |
| 4,948,030 A | 8/1990 | Chason et al. |
| 4,949,455 A | 8/1990 | Nakamura et al. |
| 4,953,060 A | 8/1990 | Lauffer et al. |
| 4,961,709 A | 10/1990 | Noschese |
| 4,965,658 A | 10/1990 | Norbeck et al. |
| 4,975,079 A | 12/1990 | Beaman et al. |
| 4,984,359 A | 1/1991 | Clark |
| 4,986,462 A | 1/1991 | Hethcoat |
| 4,996,766 A | 3/1991 | Piorunneck et al. |
| 5,006,792 A | 4/1991 | Malhi et al. |
| 5,015,192 A | 5/1991 | Welsh et al. |
| 5,015,193 A | 5/1991 | Krumme et al. |
| 5,016,795 A | 5/1991 | Porteous |
| 5,019,940 A | 5/1991 | Clemens |
| 5,021,002 A | 6/1991 | Noschese |
| 5,024,372 A | 6/1991 | Altman et al. |
| 5,029,748 A | 7/1991 | Lauterbach et al. |
| 5,031,025 A | 7/1991 | Braun et al. |
| 5,035,631 A | 7/1991 | Piorunneck et al. |
| 5,038,467 A | 8/1991 | Murphy |
| 5,041,901 A | 8/1991 | Kitano et al. |
| 5,046,957 A | 9/1991 | Millhimes |
| 5,046,972 A | 9/1991 | Pass |
| 5,048,549 A | 9/1991 | Hethcoat |
| 5,055,914 A | 10/1991 | Shimizu et al. |
| 5,060,844 A | 10/1991 | Behun et al. |
| 5,061,984 A | 10/1991 | Schraivogel et al. |
| 5,065,281 A | 11/1991 | Hernandez et al. |
| 5,073,117 A | 12/1991 | Malhi et al. |
| 5,085,602 A | 2/1992 | Bauman et al. |
| 5,086,337 A | 2/1992 | Noro et al. |
| 5,088,190 A | 2/1992 | Malhi et al. |
| 5,090,116 A | 2/1992 | Henschen et al. |
| 5,093,986 A | 3/1992 | Mandai et al. |
| 5,093,987 A | 3/1992 | Scholz |
| 5,096,435 A | 3/1992 | Noschese et al. |
| 5,098,306 A | 3/1992 | Noschese et al. |
| 5,098,311 A | 3/1992 | Roath et al. |
| 5,104,324 A | 4/1992 | Grabbe et al. |
| 5,111,991 A | 5/1992 | Clawson et al. |
| 5,116,247 A | 5/1992 | Enomoto et al. |
| 5,118,027 A | 6/1992 | Braun et al. |
| 5,120,237 A | 6/1992 | Fussell et al. |
| 5,127,839 A | 7/1992 | Korsunsky et al. |
| 5,131,871 A | 7/1992 | Banakis et al. |
| 5,140,405 A | 8/1992 | King et al. |
| 5,145,104 A | 9/1992 | Apap et al. |
| 5,145,384 A | 9/1992 | Asakawa et al. |
| 5,151,040 A | 9/1992 | Tanaka |
| 5,159,532 A | 10/1992 | Kilian et al. |
| 5,167,545 A | 12/1992 | O'Brien et al. |
| 5,168,320 A | 12/1992 | Lutz et al. |
| 5,168,425 A | 12/1992 | Radack, Jr. |
| 5,176,528 A | 1/1993 | Fry et al. |
| 5,178,564 A | 1/1993 | Kachlic et al. |
| 5,184,961 A | 2/1993 | Ramirez et al. |
| 5,184,962 A | 2/1993 | Noschese |
| 5,188,535 A | 2/1993 | Bertho et al. |
| 5,197,887 A | 3/1993 | Davidge et al. |
| 5,199,885 A | 4/1993 | Korsunsky et al. |
| 5,203,075 A | 4/1993 | Angulas et al. |
| 5,207,372 A | 5/1993 | Funari et al. |
| 5,222,649 A | 6/1993 | Funari et al. |
| 5,227,718 A | 7/1993 | Stowers et al. |
| 5,229,016 A | 7/1993 | Hayes et al. |
| 5,236,368 A | 8/1993 | Adams et al. |
| 5,237,203 A | 8/1993 | Massaron |
| 5,241,134 A | 8/1993 | Yoo |
| 5,244,143 A | 9/1993 | Ference et al. |
| 5,254,019 A | 10/1993 | Noschese |
| 5,255,839 A | 10/1993 | Alves et al. |
| 5,258,330 A | 11/1993 | Khandros et al. |
| 5,258,648 A | 11/1993 | Lin |
| 5,261,155 A | 11/1993 | Angulas et al. |
| 5,269,453 A | 12/1993 | Melton et al. |
| 5,272,295 A | 12/1993 | Sawada et al. |
| 5,274,528 A | 12/1993 | Noschese et al. |
| 5,275,330 A | 1/1994 | Isaacs et al. |
| 5,281,160 A | 1/1994 | Walkup et al. |
| 5,284,287 A | 2/1994 | Wilson et al. |
| 5,287,617 A | 2/1994 | Murphy |
| 5,288,959 A | 2/1994 | Henschen |
| 5,292,559 A | 3/1994 | Joyce, Jr. et al. |
| 5,293,067 A | 3/1994 | Thompson et al. |
| 5,298,194 A | 3/1994 | Carter et al. |
| 5,302,853 A | 4/1994 | Volz et al. |
| 5,303,466 A | 4/1994 | Ozai et al. |
| 5,305,185 A | 4/1994 | Samarov et al. |
| 5,305,879 A | 4/1994 | Noschese |
| 5,306,546 A | 4/1994 | Schreiber et al. |
| 5,308,248 A | 5/1994 | Davidge et al. |
| 5,310,357 A | 5/1994 | Olson |
| 5,314,361 A | 5/1994 | Ney et al. |
| 5,324,569 A | 6/1994 | Nagesh et al. |
| 5,329,426 A | 7/1994 | Villani |
| 5,334,038 A | 8/1994 | Davidge et al. |
| 5,334,053 A | 8/1994 | Noschese |
| 5,334,059 A | 8/1994 | Seidler |
| 5,334,422 A | 8/1994 | Myers et al. |
| 5,342,211 A | 8/1994 | Broeksteeg |
| 5,342,221 A | 8/1994 | Peterson |
| 5,345,061 A | 9/1994 | Chanasyk et al. |
| 5,346,118 A | 9/1994 | Degani et al. |
| 5,347,162 A | 9/1994 | Pasch |
| 5,350,292 A | 9/1994 | Sanders et al. |
| 5,354,218 A | 10/1994 | Fry et al. |
| 5,355,283 A | 10/1994 | Marrs et al. |
| 5,357,074 A | 10/1994 | Pawlikowski |
| 5,358,417 A | 10/1994 | Schmedding |
| 5,377,902 A | 1/1995 | Hayes |
| 5,380,212 A | 1/1995 | Smeenge, Jr. et al. |
| 5,380,213 A | 1/1995 | Piorunneck et al. |
| 5,382,179 A | 1/1995 | Noschese |
| 5,387,139 A | 2/1995 | McKee et al. |
| 5,389,006 A | 2/1995 | Noschese |
| 5,389,819 A | 2/1995 | Matsuoka |
| 5,395,250 A | 3/1995 | Englert et al. |
| 5,398,863 A | 3/1995 | Grube et al. |
| 5,399,108 A | 3/1995 | Lu et al. |

| | | | | | | |
|---|---|---|---|---|---|---|
| 5,409,157 A | 4/1995 | Nagesh et al. | | 5,706,178 A | 1/1998 | Barrow |
| 5,410,807 A | 5/1995 | Bross et al. | | 5,709,555 A | 1/1998 | Noschese |
| 5,413,491 A | 5/1995 | Noschese | | 5,716,222 A | 2/1998 | Murphy |
| 5,418,331 A | 5/1995 | Delalle | | 5,717,252 A | 2/1998 | Nakashima et al. |
| 5,419,710 A | 5/1995 | Pfaff | | 5,718,607 A | 2/1998 | Murphy et al. |
| 5,420,519 A | 5/1995 | Stowers et al. | | 5,725,400 A | 3/1998 | Morikawa et al. |
| 5,422,790 A | 6/1995 | Chen | | 5,730,606 A | 3/1998 | Sinclair |
| 5,427,535 A | 6/1995 | Sinclair | | 5,730,630 A | 3/1998 | Lacourse et al. |
| 5,429,522 A | 7/1995 | Noschese et al. | | 5,734,555 A | 3/1998 | McMahon |
| 5,431,332 A | 7/1995 | Kirby et al. | | 5,735,697 A | 4/1998 | Muzslay |
| 5,435,482 A | 7/1995 | Variot et al. | | 5,741,144 A | 4/1998 | Elco et al. |
| 5,438,481 A | 8/1995 | Murphy et al. | | 5,742,481 A | 4/1998 | Murphy et al. |
| 5,442,852 A | 8/1995 | Danner | | 5,746,608 A | 5/1998 | Taylor |
| 5,445,313 A | 8/1995 | Boyd et al. | | 5,753,857 A | 5/1998 | Choi |
| 5,451,165 A | 9/1995 | Cearley-Cabbiness et al. | | 5,761,048 A | 6/1998 | Trabucco |
| 5,453,017 A | 9/1995 | Belopolsky | | 5,766,023 A | 6/1998 | Noschese et al. |
| 5,460,537 A | 10/1995 | Noschese | | 5,772,451 A | 6/1998 | Dozier et al. |
| 5,462,456 A | 10/1995 | Howell | | 5,777,852 A | 7/1998 | Bell |
| 5,466,161 A | 11/1995 | Yumibe et al. | | 5,790,379 A | 8/1998 | Kang |
| 5,467,913 A | 11/1995 | Namekawa et al. | | 5,800,184 A | 9/1998 | Lopergolo et al. |
| 5,469,330 A | 11/1995 | Karabatsos et al. | | 5,817,973 A | 10/1998 | Elco |
| 5,475,317 A | 12/1995 | Smith | | 5,820,014 A | 10/1998 | Dozier, II et al. |
| 5,476,211 A | 12/1995 | Khandros | | 5,828,031 A | 10/1998 | Pattanaik |
| 5,477,933 A | 12/1995 | Nguyen | | 5,830,014 A | 11/1998 | Lwee et al. |
| 5,478,259 A | 12/1995 | Noschese | | 5,875,546 A | 3/1999 | Cachina et al. |
| 5,479,319 A | 12/1995 | Werther | | 5,877,554 A | 3/1999 | Murphy |
| 5,479,703 A | 1/1996 | Desai et al. | | 5,887,344 A | 3/1999 | Sinclair |
| 5,481,435 A | 1/1996 | Werther | | 5,887,355 A | 3/1999 | Wolff |
| 5,483,407 A | 1/1996 | Anastasio et al. | | 5,892,280 A | 4/1999 | Crane, Jr. et al. |
| 5,483,421 A | 1/1996 | Gedney et al. | | 5,898,566 A | 4/1999 | Noschese et al. |
| 5,489,750 A | 2/1996 | Sakemi et al. | | 5,904,581 A | 5/1999 | Pope et al. |
| 5,491,303 A | 2/1996 | Weiss | | 5,917,703 A | 6/1999 | Murphy |
| 5,492,266 A | 2/1996 | Hoebener et al. | | 5,917,707 A | 6/1999 | Khandros et al. |
| 5,495,668 A | 3/1996 | Furusawa et al. | | 5,926,375 A | 7/1999 | Watanabe et al. |
| 5,497,545 A | 3/1996 | Watanabe et al. | | 5,980,322 A | 11/1999 | Madsen et al. |
| 5,498,167 A | 3/1996 | Seto et al. | | 5,984,694 A | 11/1999 | Sinclair |
| 5,499,311 A | 3/1996 | DeCusatis | | 5,985,281 A | 11/1999 | Taylorson et al. |
| 5,499,487 A | 3/1996 | McGill | | 5,994,152 A | 11/1999 | Khandros et al. |
| 5,504,277 A | 4/1996 | Danner | | 5,997,317 A | 12/1999 | Pei et al. |
| 5,511,985 A | 4/1996 | Noschese et al. | | 6,007,348 A | 12/1999 | Murphy |
| 5,515,604 A | 5/1996 | Horine et al. | | 6,016,254 A | 1/2000 | Pfaff |
| 5,516,030 A | 5/1996 | Denton | | 6,020,389 A | 2/2000 | Hoheneder |
| 5,516,032 A | 5/1996 | Sakemi et al. | | 6,020,635 A | 2/2000 | Murphy |
| 5,518,410 A | 5/1996 | Masami | | 6,021,045 A | 2/2000 | Johnson |
| 5,518,426 A | 5/1996 | Plainer | | 6,024,584 A * | 2/2000 | Lemke et al. .................. 439/83 |
| 5,519,580 A | 5/1996 | Natarajan et al. | | 6,056,558 A | 5/2000 | Lin et al. |
| 5,531,021 A | 7/1996 | Kolman et al. | | 6,079,891 A * | 6/2000 | Berthelot ................... 400/690.4 |
| 5,534,127 A | 7/1996 | Sakai | | 6,093,035 A * | 7/2000 | Lemke et al. .................. 439/83 |
| 5,535,513 A | 7/1996 | Frantz | | 6,099,365 A | 8/2000 | Cachina et al. |
| 5,539,153 A | 7/1996 | Schwiebert et al. | | 6,116,921 A | 9/2000 | Scholz et al. |
| 5,541,449 A | 7/1996 | Crane, Jr. et al. | | 6,135,784 A | 10/2000 | Pei |
| 5,542,174 A | 8/1996 | Chiu | | 6,139,336 A | 10/2000 | Olson |
| 5,545,050 A | 8/1996 | Sato et al. | | 6,146,203 A | 11/2000 | Elco et al. |
| 5,545,051 A | 8/1996 | Summers et al. | | 6,155,845 A | 12/2000 | Lin et al. |
| 5,551,883 A | 9/1996 | Davis | | 6,164,983 A * | 12/2000 | Lemke et al. .................. 439/83 |
| 5,562,462 A | 10/1996 | Matsuba et al. | | 6,174,172 B1 | 1/2001 | Kazama |
| 5,575,686 A | 11/1996 | Noschese | | 6,206,735 B1 | 3/2001 | Zanolli |
| 5,576,631 A | 11/1996 | Stowers et al. | | 6,210,182 B1 | 4/2001 | Elco et al. |
| 5,591,049 A | 1/1997 | Dohnishi | | 6,213,787 B1 | 4/2001 | Murphy |
| 5,591,941 A | 1/1997 | Acocella et al. | | 6,217,348 B1 | 4/2001 | Lin et al. |
| 5,593,322 A | 1/1997 | Swamy et al. | | 6,247,635 B1 | 6/2001 | Olson |
| 5,596,224 A | 1/1997 | Murphy et al. | | 6,256,202 B1 | 7/2001 | Murphy |
| 5,604,379 A | 2/1997 | Mori | | 6,257,899 B1 | 7/2001 | Walkup |
| 5,607,609 A | 3/1997 | Sakuyama et al. | | 6,274,823 B1 | 8/2001 | Khandros et al. |
| 5,613,882 A | 3/1997 | Hnatuck et al. | | 6,313,530 B1 | 11/2001 | Murphy |
| 5,618,207 A | 4/1997 | Maejima | | 6,325,280 B1 | 12/2001 | Murphy |
| RE35,549 E | 7/1997 | Seidler | | 6,325,644 B1 * | 12/2001 | Lemke et al. .................. 439/83 |
| 5,643,009 A | 7/1997 | Dinkel et al. | | 6,329,631 B1 | 12/2001 | Yueh |
| 5,646,447 A | 7/1997 | Ramsey et al. | | 6,352,437 B1 | 3/2002 | Tate |
| 5,647,756 A | 7/1997 | Twigg et al. | | 6,358,068 B1 * | 3/2002 | Houtz ............................ 439/83 |
| 5,652,463 A | 7/1997 | Weber et al. | | 6,394,819 B1 | 5/2002 | Mosser |
| 5,669,774 A | 9/1997 | Grabbe | | 6,402,574 B2 | 6/2002 | Cachina et al. |
| 5,669,783 A | 9/1997 | Inoue et al. | | 6,454,157 B2 | 9/2002 | Olson |
| 5,671,121 A | 9/1997 | McMahon | | 6,494,754 B2 | 12/2002 | Cachina et al. |
| 5,691,041 A | 11/1997 | Frankeny et al. | | 6,525,179 B1 | 2/2003 | Goldstein |
| RE35,693 E | 12/1997 | Kerul et al. | | 6,545,890 B2 | 4/2003 | Pitzele |
| 5,692,920 A | 12/1997 | Banakis et al. | | 6,623,284 B1 | 9/2003 | Korsunsky |
| 5,696,027 A | 12/1997 | Crane, Jr. et al. | | 6,641,410 B2 | 11/2003 | Marvin et al. |
| 5,702,255 A | 12/1997 | Murphy et al. | | 6,692,265 B2 | 2/2004 | Kung et al. |

| | | | |
|---|---|---|---|
| 6,702,594 | B2 | 3/2004 | Lee et al. |
| 6,743,049 | B2 | 6/2004 | Perugini et al. |
| 6,777,105 | B2 | 8/2004 | Kadokawa |
| 6,783,375 | B2 | 8/2004 | He |
| 7,168,964 | B2 * | 1/2007 | Lemke et al. ............ 439/83 |
| 7,186,123 | B2 * | 3/2007 | Lemke et al. ............ 439/83 |
| 7,476,110 | B2 * | 1/2009 | Lemke et al. ............ 439/83 |
| 7,802,999 | B2 * | 9/2010 | Lemke et al. ............ 439/83 |
| 2002/0061687 | A1 | 5/2002 | Cachina |

FOREIGN PATENT DOCUMENTS

| | | |
|---|---|---|
| EP | 0 706 240 | 4/1996 |
| EP | 0 782 220 | 7/1997 |
| EP | 0 843 383 | 5/1998 |
| GB | 2-009-528 A | 6/1979 |
| GB | 37 12691 | 6/1998 |
| JP | 60-72663 | 4/1985 |
| JP | 02-25172 U | 2/1990 |
| JP | 2-239577 | 9/1990 |
| JP | 0278893 | 11/1990 |
| JP | 04-105468 U | 9/1992 |
| JP | 5-27957 | 4/1993 |
| JP | 8-31873 | 2/1996 |
| JP | 08-046077 A | 2/1996 |
| JP | 08-111581 A | 4/1996 |
| JP | 8-118003 | 5/1996 |
| JP | 8-213070 | 8/1996 |
| JP | 08-213070 U | 8/1996 |
| JP | 09-55244 A | 2/1997 |
| JP | 08-088295 A | 4/2009 |
| JP | 08-148236 U | 6/2009 |
| WO | WO 86/07204 | 12/1986 |
| WO | WO 95/24747 | 9/1995 |
| WO | PCT 96/42123 | 7/1996 |
| WO | PCT 97/20454 | 7/1997 |
| WO | PCT 97/45896 | 12/1997 |
| WO | PCT 98/15990 | 4/1998 |

OTHER PUBLICATIONS

McGraw-Hill Dictionary of Scientific Terms—First Edition, Mar. 20, 1979.
Shimizu, Junicho, "Plastic Ball Grid Arrary Coplanrity," Citizen Watch Co., Ltd., Tokyo, Japan, pp. 86-91, 1993.
Intel Corporation, Mark: "Cool Your 486 or Pentium Processor," (1 page); 486 Microprocessor Heat Sink Assembly—Heat Away, Patent Pending, (1 page); "Pentium Mircoprocessor Heat Sink Assembly—Heat Away," Patent Pending, (1 page); "Heat Away—Heat Sink Assembly Cool Relief for Your 486 Microprocessor," Patent Pending, (1 page); "Heat Away—Heat Sink Assembly Cool Relief for Your Pentium Microprocessor," Mark, (1 page); "Pentium Microprocessor Heat Sink Assembly—Heat Away," Patent Pending, (1 page); "PGA LIF or ZIP?," Patent Pending, Vemaline, (1 page): "Heat Away Assembly That Clamps," Optional Mounting, Patent Pending, (1 page) (1994).
Precision Electronic Components—E-tec the Swiss connection: "Low Profile SMD Production Sockets for Ball Grid Arrays," (1 page); Precision Electronic Components—E-tec the Swiss connection, "Ball Grid Array SMD Production Socket," Lengnau, Switzerland, (1 page) (1994).
Advanced Interconnections, "Pop-Top BGA Adapter Socket Assembly," West Warwick, RI, p. 162, 1991.
"Special Topics in Surface Mount Soldering Problems and Other Soldering-Related Problems," Ch. 10, pp. 305-328 (1989).
"Get Rapid Response to Your Custom High Density Applications," TEKA Interconnection Systems, Inc., Providence, RI, 1991 Interplex Industries, Inc., (6 pages).
"Introducing TEKA's Newest High Density Pin Header, The 68 Pin Smart Card Interface," TEKA Interconnection Systems, Inc., Providence, RI, (4 pages) (1989).

"High-density Connector System," TEKA Interconnections Systems, Inc., Providence, RI, 1988 Interplex Industries, Inc. (4 pages).
"Knockouts," TEKA Interconnection Systems, inc., Providence, RI, 1989 Interplex Industries, Inc. (4 pages).
Davis, P.E., "The Use of Tin and Tin Alloys in the Electronics Industry," Jul. 1971, pp. 694-699.
IBM Technical Disclosure Bulletin (TDB): "Method for Modified Solder Reflow Chip Joining," Feb. 1974, p. 2900; "Replacement of Missing Solder Balls by Transient Wetting Transfer," vol. 39, Pub. No. 7, Jul. 1996; pp. 281-282.
Ginsberg, G.L., "Connectors and Interconnections Handbook," vol. 2, Connector Types, The Electronic Connector Study Group, Inc., Fort Washington, PA, Oct. 1979 and Aug. 1980, pp. 6-1/6-40.
"TEKA's New SMT Connectors Have the Solder Right Where You Want It," Electronics, Nov. 3, 1981, (4 pages).
Bilotta, A.J., "Connections in Electronic Assemblies," Manufacturing Engineering and Materials Processing, Marcel Dekker, Inc., 1985, pp. 175-201, 269-271.
Keller, et al., U.S. Statutory Invention Registration, Reg. No. H498, Jul. 5, 1988, (7 pages).
IBM Technical Disclosure Bulletin (TDB): "Formed-In-Place Solder Preform Process," Feb. 1989, pp. 25-26.
IBM Technical Disclosure Bulletin (TDB): "High Density/High Performance Cable I/O Connector System," Oct. 1989, pp. 62-66.
Derman, G.B., "Connectors and Interconnections Handbook," Basic Technology, Int'l Inst. Of Connector and interconnection Technology, Inc., vol. 1 (Revised Edition), pp. 45-104 (1990).
IBM Technical Disclosure Bulletin (TDB), "Solder Ball Module Stabilizer," Feb. 1991, pp. 464-465.
Yamada, M., et al., "Packaging Technology for the NEC ACOS System 3900," Computer Engineering Division, NEC Corporation, Tokyo, Japan, 1992 IEEE, pp. 745-751.
"Die Replacement" & "Yield Considerations," Advanced Packaging, Mar./Apr. 1994, pp. 41-42.
Schmolze, C.A., "Burn-In Sockets for Ball Grid Arrays (BGAs)," Ball Grid Array Technology, Chapter 17, McGraw-Hill, Inc., 1995, pp. 517-541.
"Ball Grid Array Socketing System," Advance Interconnections, West Warwick, RI, Jun. 1995, pp. 1-4.
"Socketalk," Quarterly Newsletter, Plastronics Socket Co., Inc., Irving, Texas, vol. IV, Aug. 1995 (1 page).
Roman, D., "Methode Preps BGA Sockets," EBN, Sep. 11, 1995, p. 61.
Ghaffarian, R., Ph.D., "Technology Readiness Overview: Ball Grid Array and Chip Scale Packaging," pp. 1-12, Jan. 2003.
English Version of ROC Application No. 84106428 (267265), filed Jun. 22, 1995; ROC Version of Application No. 84106428 (267265), filed Jun. 12, 1995.
English Version of ROC Application No. 86113845 (406454), filed Oct. 1, 1993; ROC Version of Application No. 86113845 (406454), filed Oct. 1, 1993.
English Version of ROC Application No. 85113693 (318971), filed Oct. 1, 1993; ROC Version of Application No. 85113693 (318971), filed Oct. 1, 1993.
IBM Technical Disclosure Bulletin (TDB), "Dispensing Flux Paste in Ball Grid Array Assembly," vol. 39, Pub. No. 11, pp. 165-166, Nov. 1996.
Defendants' Disclosure of Preliminary Invalidity Contentions and Documents Production, Under Patent L.R. 3-3 and 3-4, *FCI USA, Inc. et al. v. Hon Hai Precision Industry Co., Ltd. & Foxconn Electronics, Inc.*, C-03-4519 JCS (N.D. Cal.) (2004).
Defendants' Final Invalidity Contentions, *FCI USA, Inc. et al. v. Hon Hai Precision Industry Co., Ltd. & Foxconn Electronics, Inc.*, C-03-4519 JCS (N.D. Cal.) (2003).
EPO Search Report dated Nov. 6, 2007.

* cited by examiner

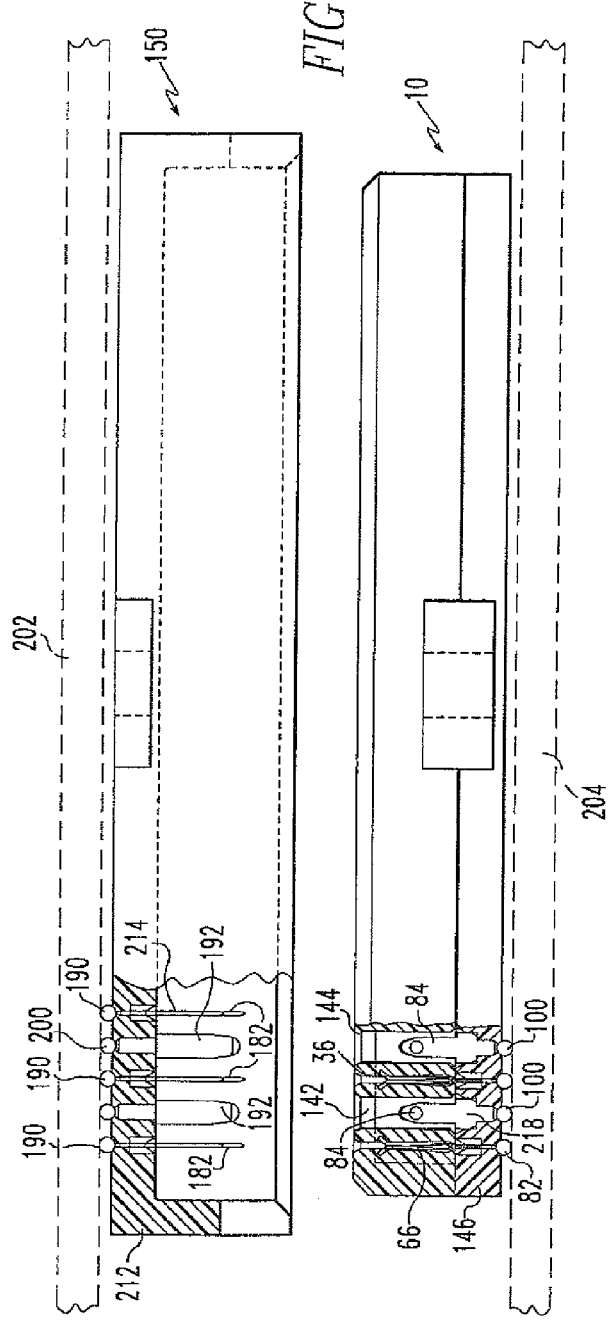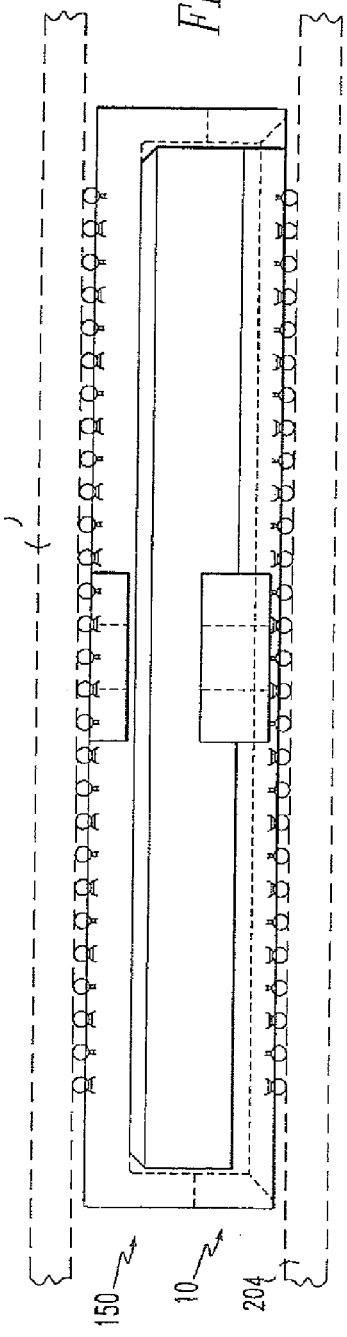

(BLUE) : 0 – 133N/mn²

(YELLOW) : 133 – 239N/mm²

HIGH DENSITY CONNECTOR AND METHOD OF MANUFACTURE

CROSS-REFERENCE TO RELATED APPLICATIONS

This application is a continuation of U.S. application Ser. No. 12/352,227 filed Jan. 12, 2009 now U.S. Pat. No. 7,802,999, entitled "High Density Connector and Method of Manufacture", which is a continuation of U.S. application Ser. No. 11/668,435 filed Jan. 29, 2007 now U.S. Pat. No. 7,476,110, entitled "High Density Connector and Method of Manufacture", which is a continuation of U.S. application Ser. No. 11/272,212 filed Nov. 10, 2005 now U.S. Pat. No. 7,168,964, entitled "High Density Connector and Method of Manufacture", which is a divisional of U.S. patent application Ser. No. 09/953,631, now U.S. Pat. No. 7,186,123, filed Sep. 14, 2001, entitled "High Density Connector and Method of Manufacture", which is a continuation of U.S. patent application Ser. No. 09/284,230, filed Jul. 7, 1999, now U.S. Pat. No. 6,325,644 entitled "High Density Connector and Method of Manufacture", which is a 371 of PCT/US97/18354 filed Oct. 10, 1997 and a continuation of U.S. patent application Ser. No. 08/728,194 filed Oct. 10, 1996, now U.S. Pat. No. 6,024,584, and a continuation of U.S. patent application Ser. No. 08/777,579 filed Dec. 31, 1996, now U.S. Pat. No. 6,164,983, and a continuation of U.S. patent application Ser. No. 08/777,806 filed Dec. 31, 1996, now U.S. Pat. No. 6,358,068, and a continuation of U.S. patent Ser. No. 08/778,380 filed Dec. 31, 1996, now U.S. Pat. No. 6,079,991, and a continuation of U.S. patent application Ser. No. 08/778,398 filed Dec. 31, 1996, now U.S. Pat. No. 6,093,035.

BACKGROUND OF THE INVENTION

1. Field of the Invention

The present invention relates to electrical connectors and more particularly high I/O density connectors, such as array connectors.

2. Brief Description of Prior Developments

The drive to reduce the size of electronic equipment, particularly personal portable devices, and to add additional functions to such equipment, has resulted in an ongoing drive for miniaturization of all components, especially electrical connectors. Efforts to miniaturize connectors have included reducing the pitch between terminals in single or double row linear connectors, so that a relatively high number of I/O or other lines can be interconnected by connectors that fit within tightly circumscribed areas on the circuit substrates allotted for receiving connectors. The drive for miniaturization has also been accompanied by a shift in preference to surface mount techniques (SMT) for mounting components on circuit boards. The confluence of the increasing use of SMT and the required fine pitch of linear connectors has resulted in approaching the limits of SMT for high volume, low cost operations. Reducing the pitch of the terminals increases the risk of bridging adjacent solder pads or terminals during reflow of the solder paste. To satisfy the need for increased I/O density, array connectors have been proposed. Such connectors have a two dimensional array of terminals mounted on an insulative substrate and can provide improved density. However, these connectors present certain difficulties with respect to attachment to the circuit substrates by SMT techniques because the surface mount tails of most, if not all, of the terminals must be beneath the connector body. As a result, the mounting techniques used must be highly reliable because it is difficult to visually inspect the solder connections or repair them, if faulty. In the mounting of an integrated circuit (IC) on a plastic or ceramic substrate the use of ball grid array (BGA) and other similar packages has become common. In a BGA package, spherical solder balls attached to the IC package are positioned on electrical contact pads of a circuit substrate to which a layer of solder paste has been applied, typically by use of a screen or mask. The unit is then heated to a temperature at which the solder paste and at least a portion or all of the solder ball melt and fuse to an underlying conductive pad formed on the circuit substrate. The IC is thereby connected to the substrate without need of external leads on the IC.

While the use of BGA and similar systems in connecting an IC to a substrate has many advantages, a corresponding means for mounting an electrical connector or similar component on a printed wiring board (PWB) or other substrate has yet to be developed. It is important for most situations that the substrate-engaging surfaces of the solder balls are coplanar to form a substantially flat mounting interface, so that in the final application the balls will reflow and solder evenly to a planar printed circuit board substrate. Any significant differences in solder coplanarity on a given substrate can cause poor soldering performance when the connector is reflowed onto a printed circuit board. To achieve high soldering reliability, users specify very tight coplanarity requirements, usually on the order of 0.004 inches. Coplanarity of the solder balls is influenced by the size of the solder ball and its positioning on the connector. The final size of the ball is dependent on the total volume of solder initially available in both the solder paste and the solder balls. In applying solder balls to a connector contact, this consideration presents particular challenges because variations in the volume of the connector contact received within the solder mass affect the potential variability of the size of the solder mass and therefore the coplanarity of the solder balls on the connector along the mounting interface.

Another problem presented in soldering connectors to a substrate is that connectors often have insulative housings which have relatively complex shapes, for example, ones having numerous cavities. Residual stresses in such thermoplastic housings can result from the molding process, from the build up of stress as a result of contact insertion or a combination of both. These housings may become warped or twisted either initially or upon heating to temperatures necessary in SMT processes, such as temperatures necessary to reflow the solder balls. Such warping or twisting of the housing can cause a dimensional mismatch between the connector assembly and the PWB, resulting in unreliable soldering because the surface mounting elements, such as solder balls, are not sufficiently in contact with the solder paste or close to the PWB prior to soldering.

A need, therefore, exists for reliably and efficiently mounting high density electrical connectors on substrates by surface mounting techniques.

SUMMARY OF THE INVENTION

Electrical connectors according to the present invention provide high I/O density and reliable attachment to circuit substrates by SMT techniques. These connectors exhibit high coplanarity along the mounting interface.

Electrical connectors of the present invention are ones in which one or more terminals are connectable by a fusible electrically conductive material to a substrate. This fusible electrically conductive material is a solder mass, preferably comprising a solder ball that can be reflowed to provide the primary electrical current path between the terminal and a circuit substrate.

An aspect of the invention includes methods for forming an exterior fusible conductive contact on an element of an electrical connector. According to one method, a recess is formed on the exterior side of the connector elements or contacts. A section of a conductive contact extends from adjacent the interior side of the conductor element into the recess on the exterior side of the housing. The recess is filled with a controlled volume of solder paste. A fusible conductive element, for example a solder ball, is positioned in the recess on the exterior side of the housing. The conductive element placed in the recess is then heated to a temperature sufficient to fuse the solder paste and fuse the fusible conductive element to the section of the contact extending into said recess.

Also encompassed by this invention is a contact for use in an electrical connector which comprises a terminal tab area where said contact is connectable to a fusible conductive element, such as a solder ball. A medial area of the contact is positioned between the terminal tab and a contact area. The medial area is adapted to resist molten solder flow, for example, by application of a coating or plating of a non-solder wettable material. By this arrangement wicking of the solder from the solder ball from the area of attachment to the contact avoided.

Coplanarity of the surface mounting interface of the connector is maintained by providing an insulative connector housing in which stress buildup is avoided. According to this aspect of the invention, a contact terminal is inserted into an opening in the housing. The cross section of the opening is configured so that at least one side thereof has or comprises a shaped projection adapted to be deformed by the terminals as the terminal is inserted into the opening. By means of this arrangement, stress build up as a result of multiple contact insertions is avoided, so as to minimize warping and twisting of the housing.

BRIEF DESCRIPTION OF THE DRAWINGS

The method and connector of the present invention is further described with reference to the accompanying drawings in which:

FIG. 5 is a cut away end view of the receptacle and plug shown in FIGS. 1-4 in unmated relation;

FIG. 6 is an end view of the receptacle and plug shown in FIG. 5 in mated relation;

DETAILED DESCRIPTION OF THE PREFERRED EMBODIMENTS

Figure 12:
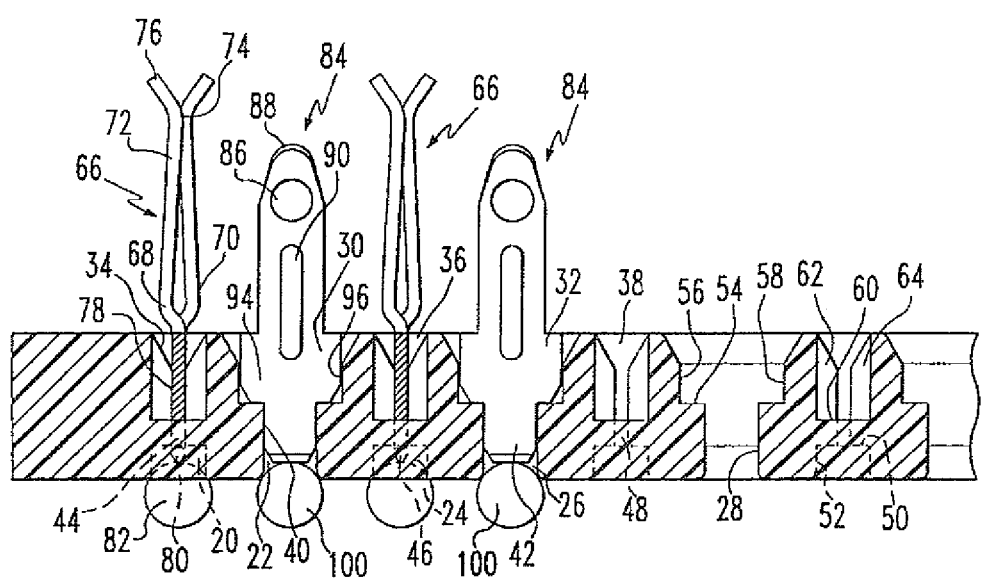
FIG. 12 is an enlarged view of the cut away area in FIG. 10.

Referring generally to FIGS. 1-2 and 12-13, a set of intermating connectors according to a first embodiment of a high density connector of the present invention includes a receptacle which is shown generally at numeral 10. A base section of the receptacle is shown generally at numeral 12. The base is preferably formed by molding an appropriate insulating polymeric material capable of withstanding SMT reflow temperatures, for example, liquid crystal polymer (LCP). Referring first to the base section, this element includes a base wall 14 having an exterior side 16 and an interior side 18. On the exterior side there are outer recesses as, for example, recesses 20, 22, 24, 26 and 28 (FIG. 12). On the interior side there are inner contact receiving recesses as, for example, recesses 30, 32, 34, 36 and 38. Connecting these inner and outer recesses are medial slots as, for example, slots 40, 42, 44, 46 and 48. Each of the outer recesses has a base wall and a lateral wall as, for example, base wall 50 and lateral wall 52 (FIG. 12). Each of the inner signal contact receiving recesses has a base wall and intersecting lateral walls as, for example, base wall 54 and lateral walls 56 and 58. Each of the inner ground or power contact receiving recesses also has a base wall and diagonal lateral walls as, for example, base wall 60 and lateral walls 62 and 64. The above described inner and outer recesses and connecting medial slots receive ground/power contacts or signal contacts.

The ground or power contacts preferably have an upper section, shown generally at numeral 66, formed of two contacting forks 68 and 70. Each of these forks has a converging section 72, a contact point 74 and an outwardly diverging or lead-in section 76. The ground or power contacts also include a medial section 78 passing through the lower wall of the receptacle and a lower section 80 that extends into the outer recess. A solder ball 82 is fused onto lower section 80, as will be described below.

Each of the signal contacts (FIGS. 12 and 13) includes an upper section shown generally at numeral 84 preferably having a contact projection 86, a lead-in bend 88 and a stiffening rib 90. The signal contacts also include a medial section 92 which passes through the lower wall of the receptacle. Each signal contact includes a lower section 98 (FIG. 13) extending into the outer recess for example, recess 22 in FIGS. 12-13, where a solder ball 100 is fused to lower section 98 as will be explained below.

Figure 1:
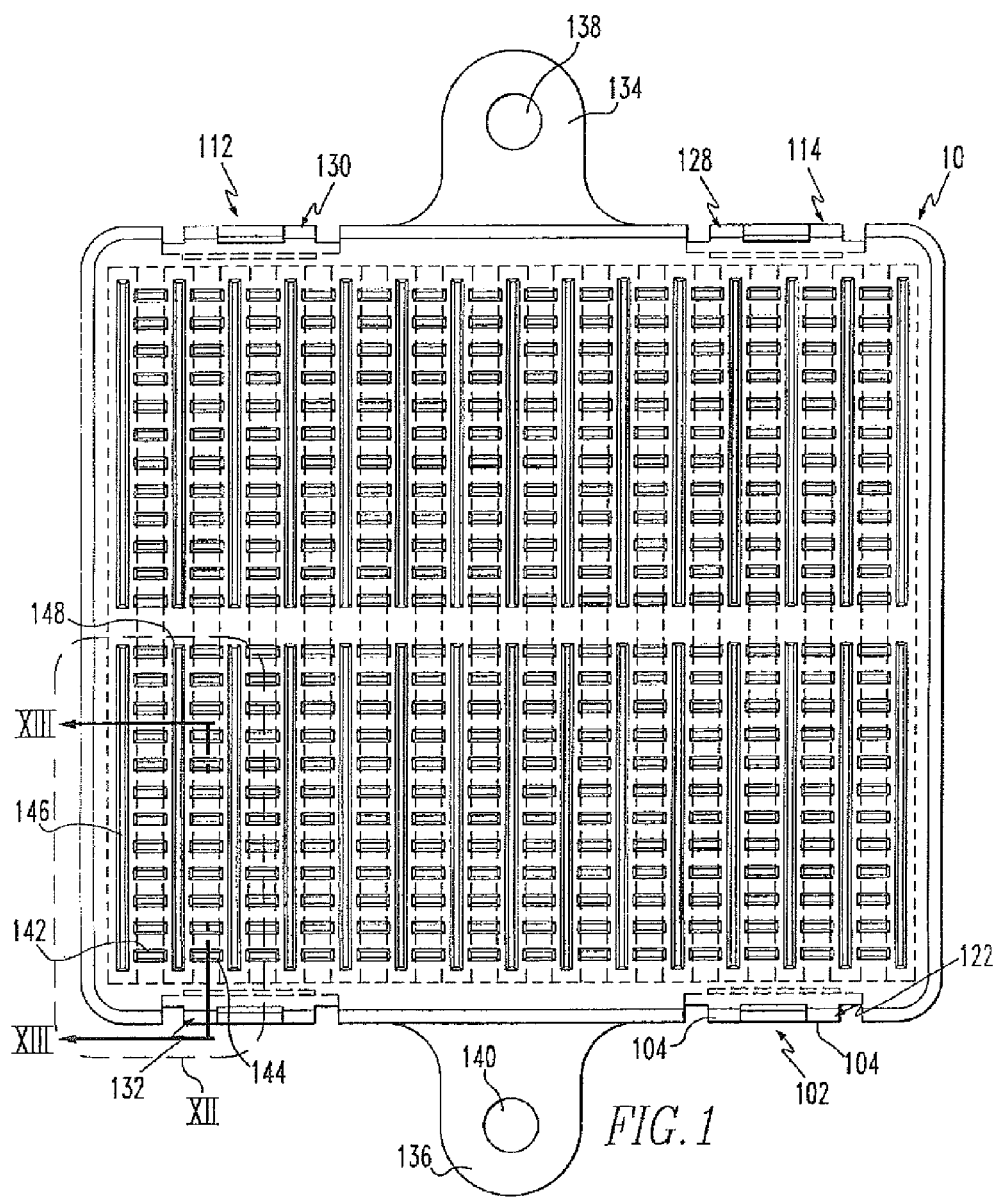
FIG. 1 is a top plan view of a receptacle connector of a preferred embodiment of the connector of the present invention.
Figure 2:
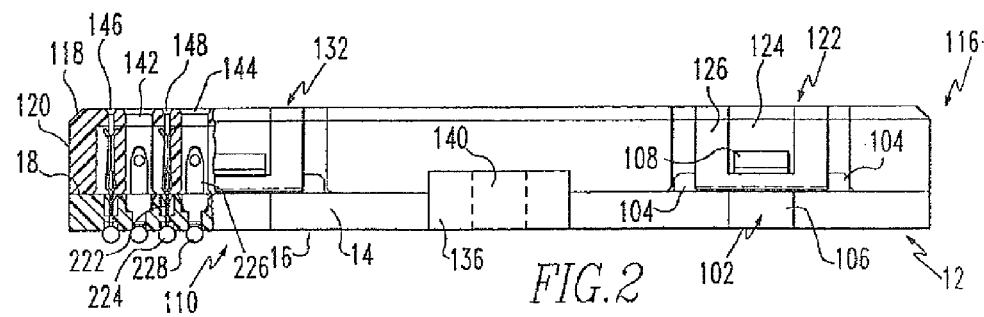
FIG. 2 is a partially cut away end view of the receptacle shown in FIG. 1.

Referring particularly to FIGS. 1-2, the base section of the receptacle includes latching structures, for example, as is shown generally at numeral 102. This latching structure includes an upward tab 104 which is superimposed over a vertical groove 106 and which has an outward projection 108. The base section of the receptacle also has other similar latching structures 110, 112 and 114. The receptacle also includes an upper section shown generally at 116 which is superimposed over the base section. This upper section has a top wall 118 and a peripheral side wall 120. This upper section is fixed to the base section by means of latching structures as is, for example, shown generally at numeral 122. Each of these latching structures has a side wall recess 124 and a U-shaped latch 126 which extends downwardly from the top wall and is spaced from the side wall recess. The tab 104 fits between the U-shaped latch 126 and the side wall recess 124 to enable the U-shaped latch to engage the outward projection 108 on the latching structure 102 of the base section. The upper section includes other similar latching structures 128, 130 and 132 which engage, respectively, latching structures 110, 112 and 114 on the base section. The upper section 116 or the base 102 also may have mounting brackets 134 and 136 which have fastener apertures 138 and 140, respectively. On the top wall 118 of the upper section 116 there are also signal contact access apertures as, for example, apertures 142 and 144. These access apertures are arranged in a plurality of rows corresponding to the rows of signal contacts in the base section. Interposed between these rows of signal contact access apertures are elongated ground or power contact access slots as, for example, slots 146 and 148. The upper section 116 forms a mating interface between receptacle 10 and a mating plug 150 described below.

Figure 3:
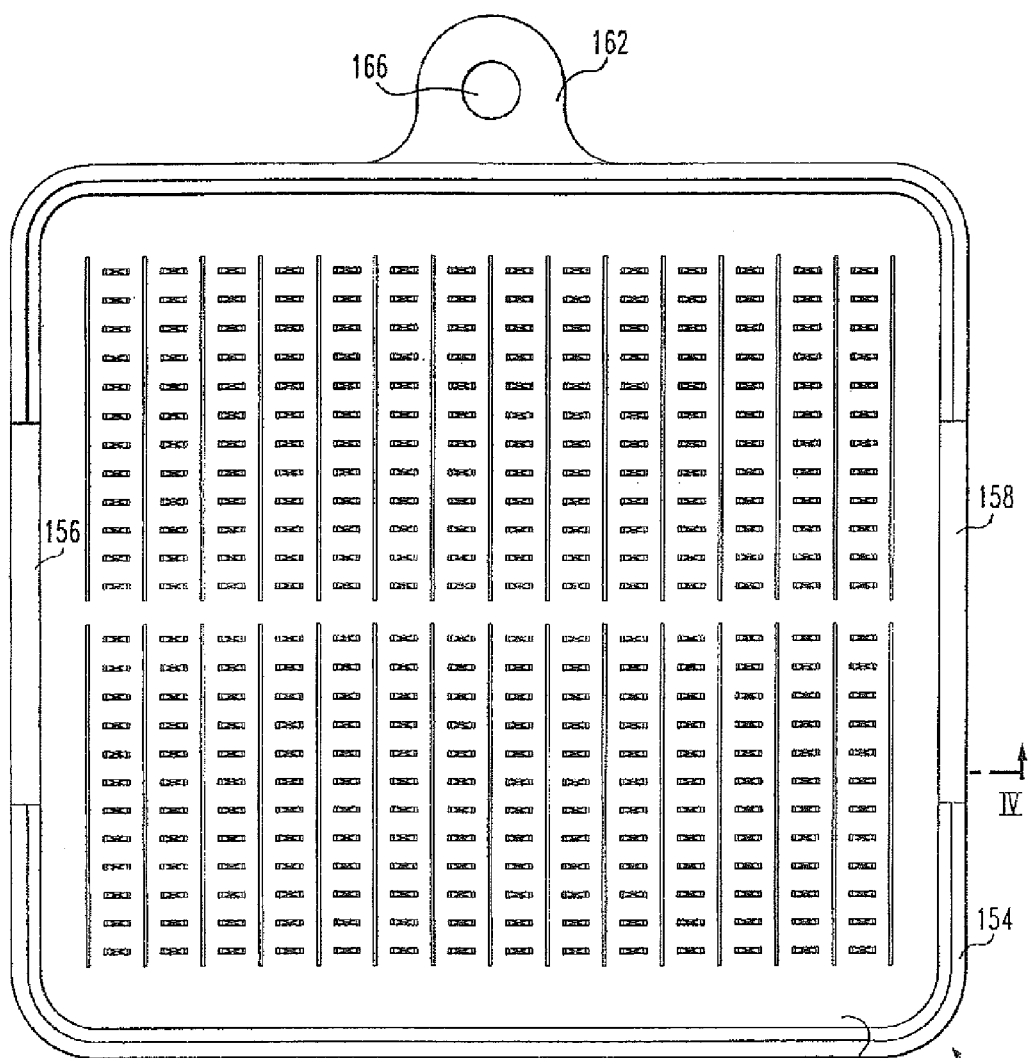
FIG. 3 is a top plan view of a plug element of a preferred embodiment of the present invention.
Figure 4:
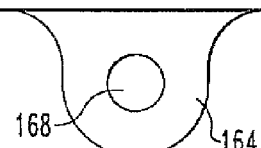
FIG. 4 is a partially cut away end view of the plug element shown in FIG. 3.
Figure 11:
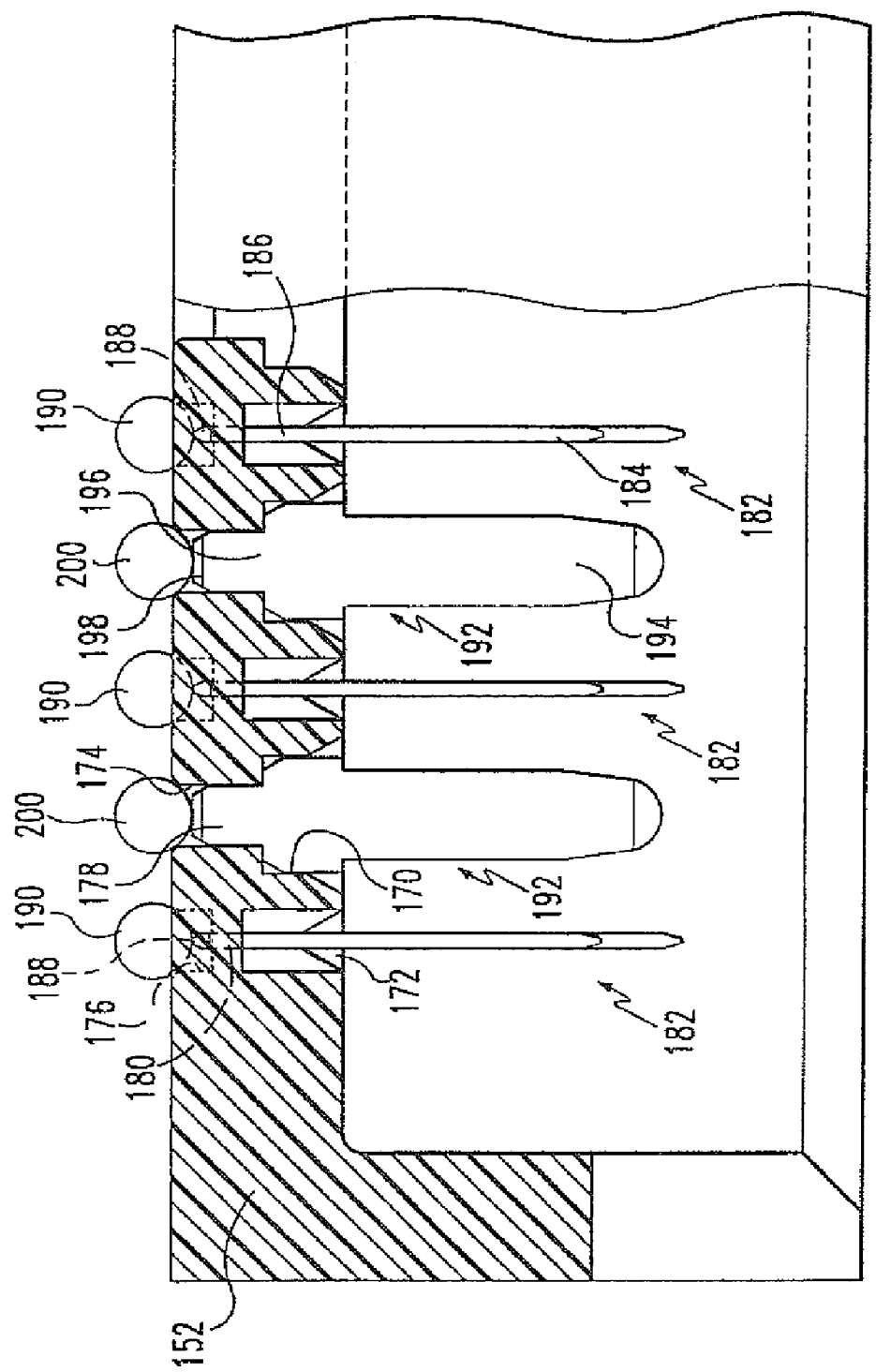
FIG. 11 is an enlarged view of the cut away area in FIG. 4.

Referring to FIGS. 3-4 and FIG. 11, the plug element of the connector is shown generally at numeral 150. The plug includes a base wall 152 and a peripheral side wall 154. There are opposed gaps 156 and 158 in the side wall and there is an open side 160 in opposed relation to the base wall. Projecting laterally from the plug are mounting brackets 162 and 164 having fastener receiving apertures 166 and 168 respectively, that are alignable with the fastener receiving apertures 138, 140 in the mounting brackets of the receptacle.

Referring to FIG. 11, on the inner side of the base wall 152 there are inner signal contact receiving recesses such as recess 170. Also on the inner side of the base wall are inner power or ground contact receiving recesses such as recess 172. In opposed relation to the outer recesses on the base wall there are outer signal contact receiving recesses such as recess 174, and outer power or ground contact receiving recesses, as at recess 176. Connecting the outer and inner signal contact receiving recesses and the outer and inner power or ground contact receiving recesses are, respectively, medial slots 178 and 180. Mounted in the power/ground contact receiving recesses via the medial slots 180 are power or ground contacts, shown generally at numeral 182. Each contact 182 has an elongated inner section 184, an elongated medial section 186, which is mounted in base wall 152, and an outer section 188 extending into recess 176. A solder ball 190 is fused onto section 188. The outer section 188 and the solder ball are partially contained in the outer recess 176. The plug also includes a plurality of signal contacts 192. These signal contacts each have an inner section 194, a medial section 196 mounted in the base wall, and a terminal tab 198 extending into recess 174. A solder ball 200 is fused onto terminal tab 198. Again it will be observed that this outer section and the solder ball are partially contained in the outer recess as at 170.

Referring to FIGS. 5-7c, it will be seen that the plug described above is mounted on a circuit substrate, such as a rigid PWB 202, and the receptacle is mounted on a similar PWB 204. The plug and receptacle thereby form a board to board interconnection, as illustrated in FIG. 6. The plug has a two dimensional array of signal contacts, such as 192 onto which are fused solder balls 200 and a plurality of ground/power contacts, such as contacts 192, onto which are fused solder balls 190. By use of SMT techniques, the solder balls are also fused to the PWB 202 to fix the entire plug to the PWB and effect electrical contact between the signal contacts and ground or power contacts in the plug and the PWB. It will be appreciated that although not all contacts are illustrated in FIG. 5, all such contacts are connected to solder balls and to the PWB in the same way. Similarly, solder balls 100 are fused onto receptacle signal contacts 84 and those solder balls are fused to the PWB 204. Receptacle ground/power contacts 66 are mounted in slot 134 and are fused to solder balls 82 and these solder balls are fused to PWB 204.

The plug is aligned with the receptacle so that the peripheral side wall 154 of the plug overlaps the peripheral side wall 120 of the upper section 118 of the receptacle.

Figure 7A:
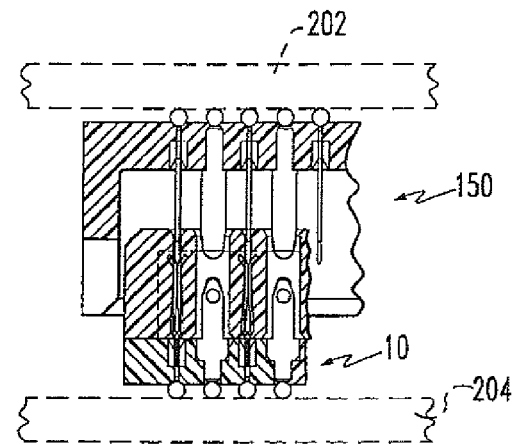
FIGS. 7a, 7b and 7c are cut away end views showing respectively first, second and third sequential stages in the mating of the receptacle end plug shown in FIG. 5.
Figure 7B:
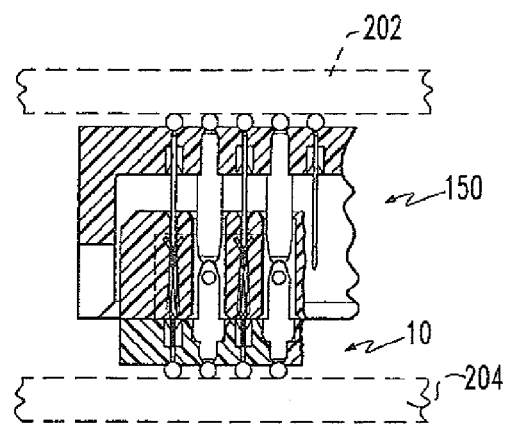
Figure 7C:
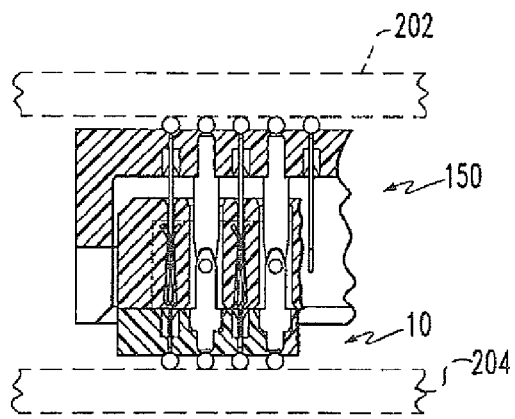

Referring particularly to FIGS. 7a-7c the engagement of the plug and receptacle is shown in greater detail. FIG. 7a shows, after initial alignment, the ground/power contacts in the plug initially entering the ground/power contact receiving slots in the receptacle and engaging the corresponding power/ground contacts in the receptacle. The signal contacts have entered the signal contact slots in the receptacle. FIG. 7b shows the signal contacts in the plug initially engaging the corresponding signal contacts in the receptacle and the power/ground contacts in the plug becoming further engaged between the opposed leaves of the power ground contacts in the receptacle. FIG. 7c shows that the signal contacts in the plug being fully engaged with the signal contacts in the receptacle. The power/ground contacts in the plug have become positioned at the base of the fork of the power/ground contacts in the receptacle.

Figure 8:
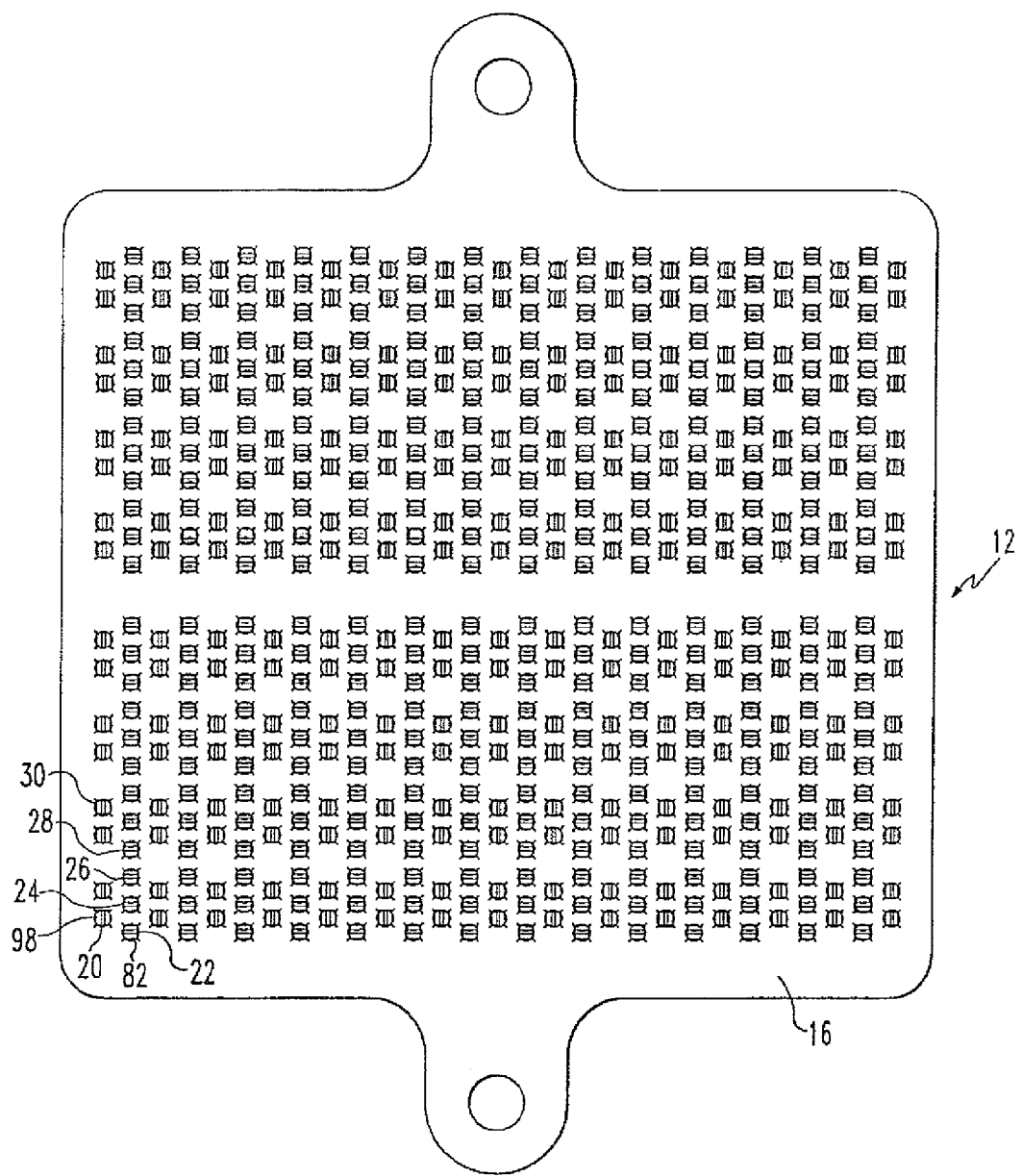
FIG. 8 is a bottom plan view of the receptacle shown in FIG. 1 before the placement of solder balls thereon.
Figure 9:
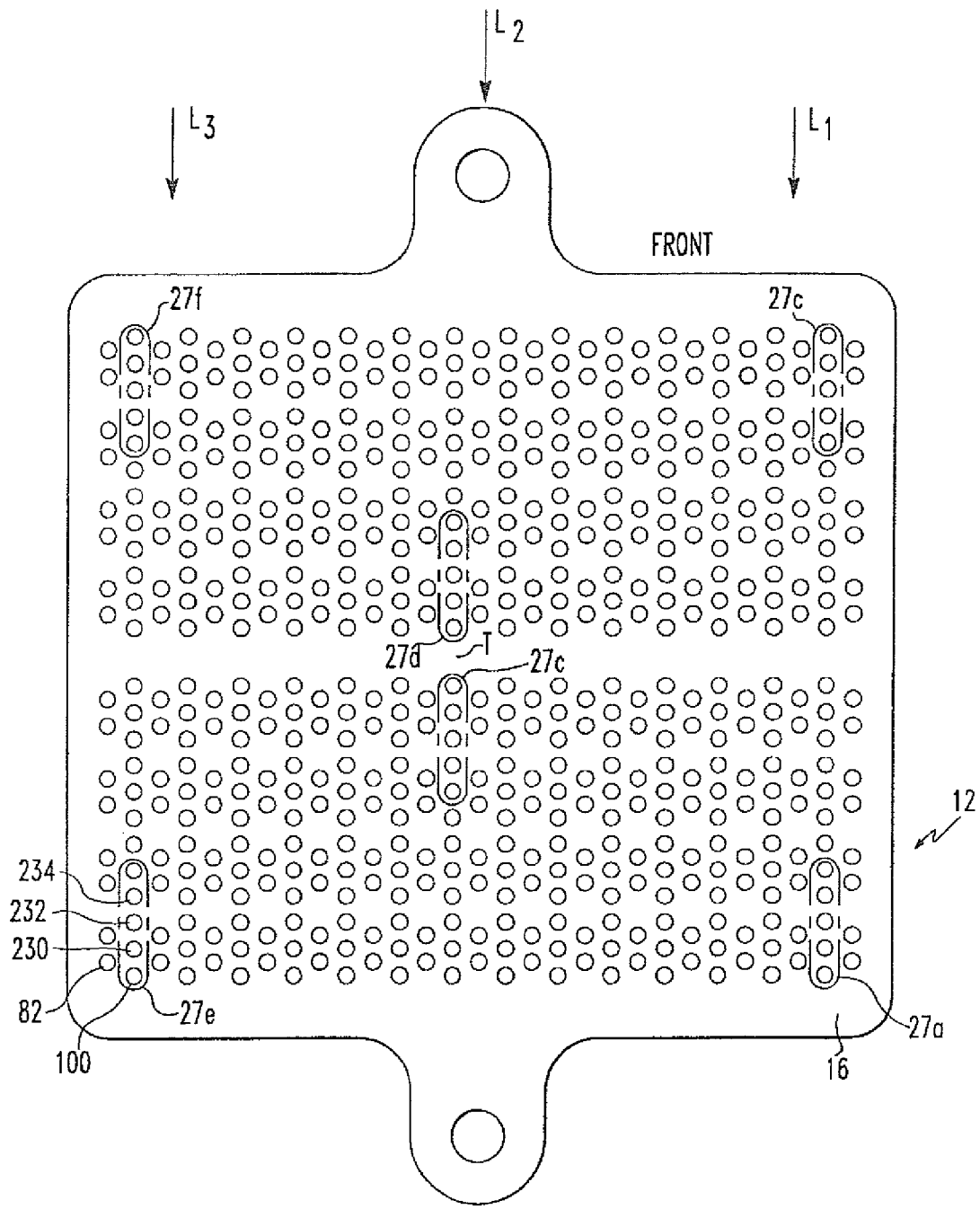
FIG. 9 is a bottom plan view of the receptacle shown in FIG. 8 after placement of the solder balls thereon.

Referring to FIG. 8, the exterior side 16 of the base section 12 of the receptacle is shown prior to the application of the solder balls. Prior to the application of the solder balls, the terminal tabs of the signal contacts, for example, terminal tab 82, and of the power ground contacts, for example terminal tab 98, are disposed within a corresponding outer recesses for example, outer recesses 20, 22, 24, 26 and 28, by insertion of the contacts into the opposite surface 18 of the base 12. A quantity of solder paste of appropriate composition is applied to substantially fill each outer recess. The solder balls are then applied over the outer or mounting surface of the base. Preferably, the outer recesses are smaller in transverse extent than the solder balls, so that the solder balls are supported on the edges of the recesses, at a position near the terminal tabs of the contacts. To maximize the stability of the solder ball in the recess, a recess that is round or the shape of a regular polygon in cross-section is preferred. The solder paste aids in holding a solder ball in each of the exposed recesses as is shown in FIG. 9, where, for example, solder ball 82 is shown in recess 20 and solder ball 100 is shown in recess 22. Additional solder balls, 230, 232 and 234 are shown, for example, in recesses 24, 26 and 28. A solder ball will be positioned in all of the outer recesses of the receptacle. It will also be understood that the exterior side of plug will be substantially identical to the exterior side of the receptacle before placement of the solder balls as is shown in FIG. 8 and after emplacement of the solder balls as is shown in FIG. 11. After emplacement of the solder balls in the outer recesses, the connector is subjected to a reflow process to fuse the solder balls onto the terminal tabs. The exterior sides of the connectors, together with the solder balls and particularly the outer surfaces of the solder balls, form a substantially planar mounting interface, along which the connector is mounted onto a supporting circuit substrate, such as a PWB.

Figure 10:
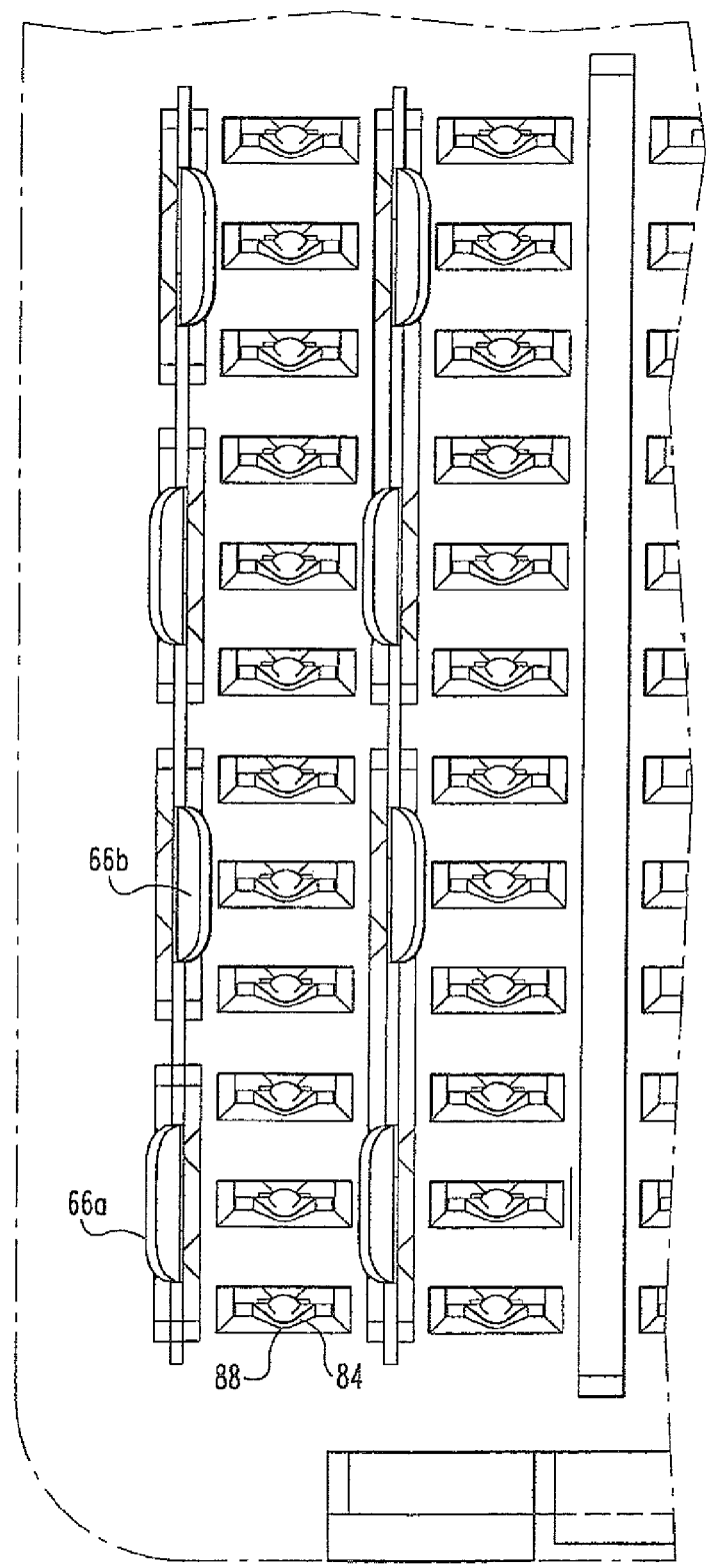
FIG. 10 is a detailed cut away view of area XII in FIG. 1.
Figure 13:
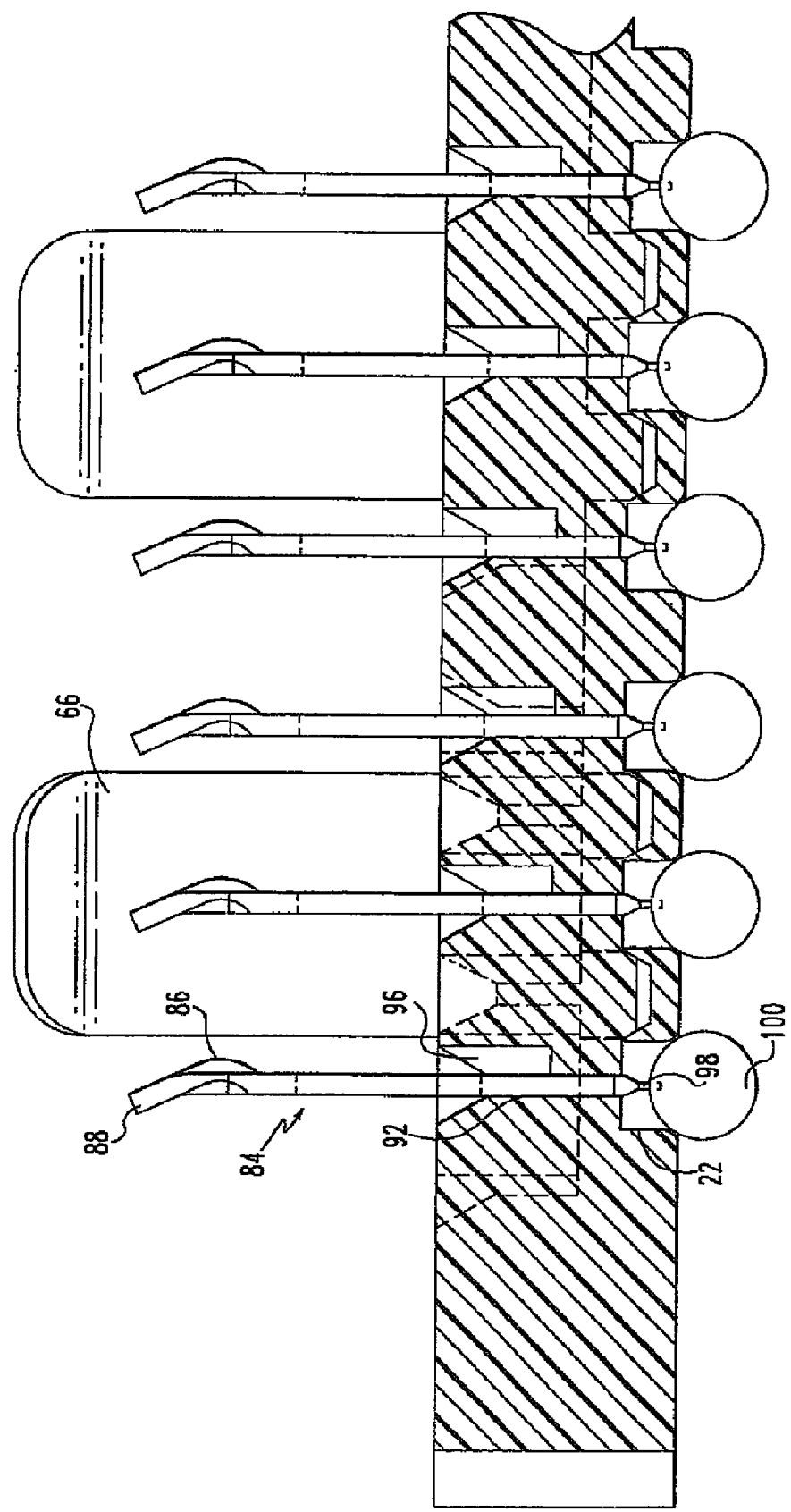
FIG. 13 is an enlarged cross sectional view through 13-13 in FIG. 10.

FIGS. 10 and 13 show a variant of the FIG. 1 embodiment wherein, instead of the forked receptacle contacts 66, oppositely disposed pairs 66a and 66b of blade type contacts engage the ground/power terminals 182.

Figure 14:
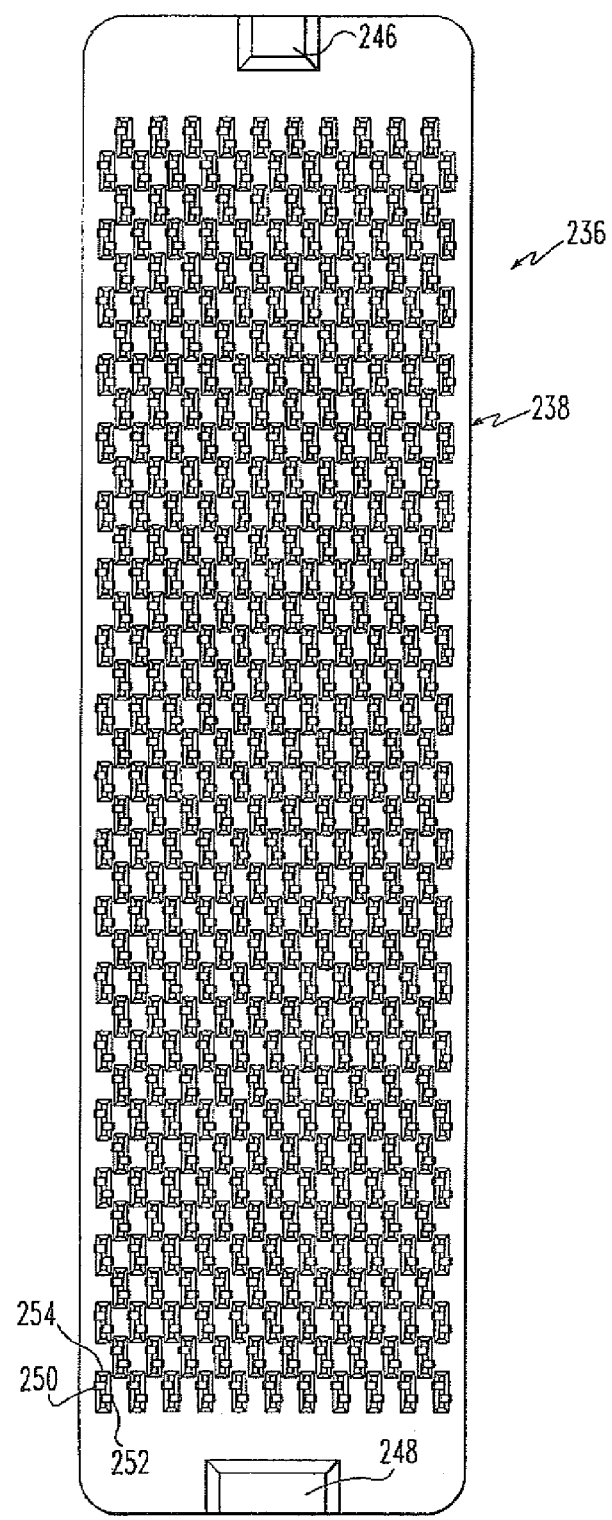
FIG. 14 is a top plan view of a second preferred embodiment of a receptacle connector of the present invention.
Figure 15:
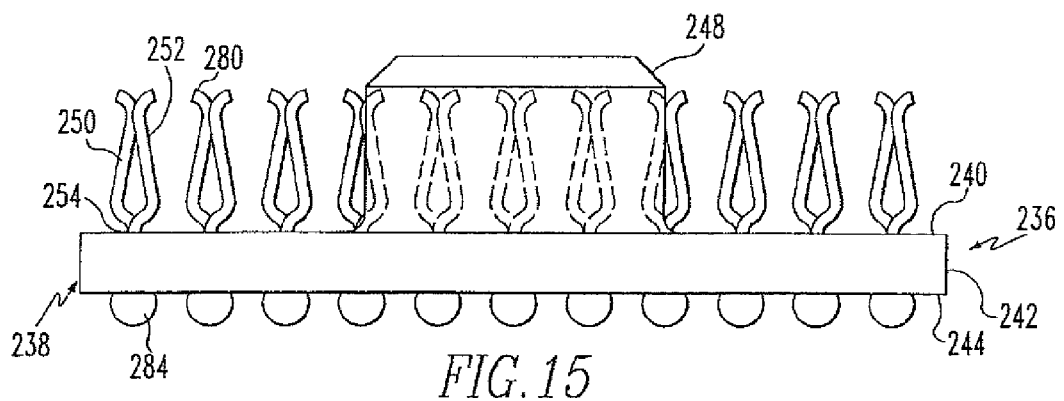
FIG. 15 is an end view of the receptacle shown in FIG. 14.
Figure 17:
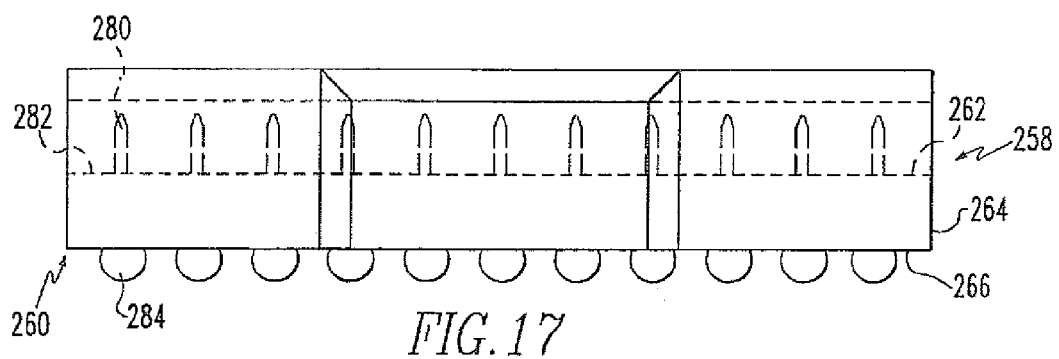
FIG. 17 is an end view of the plug shown in FIG. 16.
Figure 18:
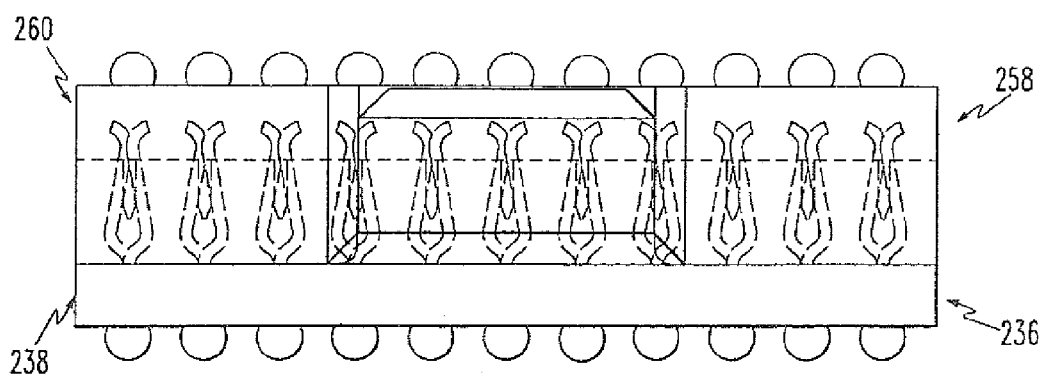
FIG. 18 is an end view of the mated receptacle and plug shown in FIGS. 14-17.
Figure 16:
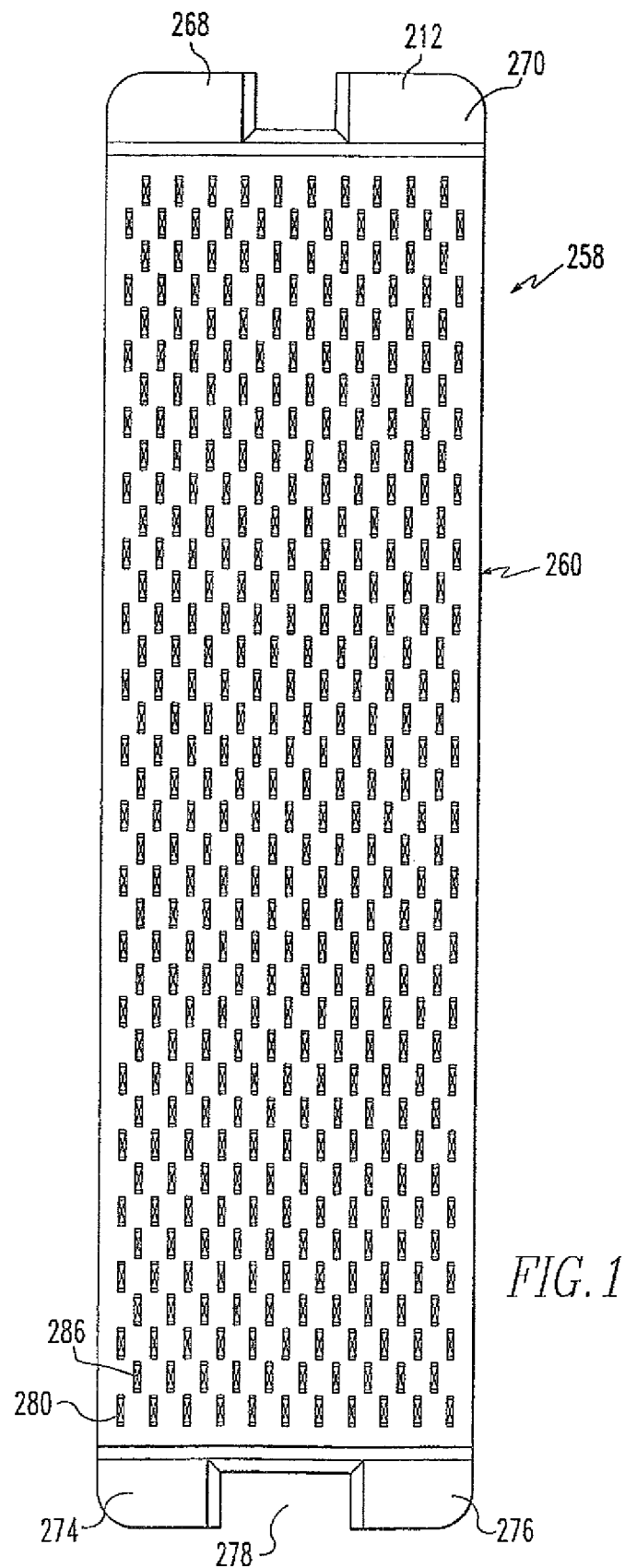
FIG. 16 is a top plan view of a second preferred embodiment of a plug connector of the present invention.
Figure 19:
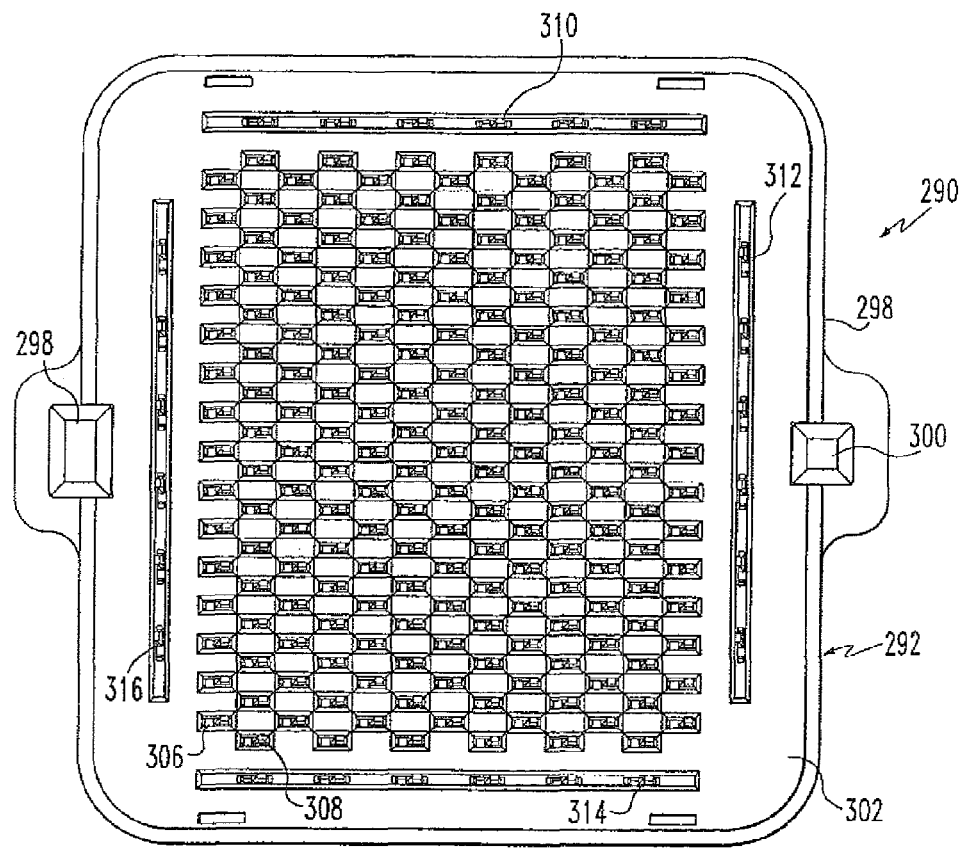
FIG. 19 is a top plan view of a receptacle used in a third preferred embodiment of a receptacle connector of the present invention.
Figure 20:
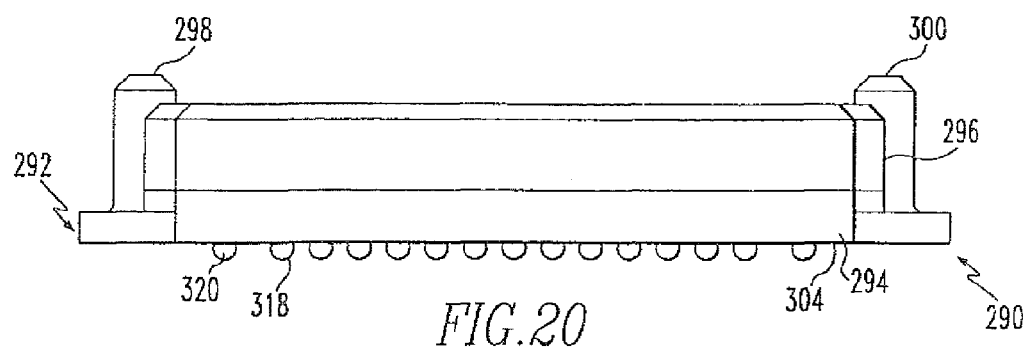
FIG. 20 is an end view of the receptacle shown in FIG. 14.
Figure 21:
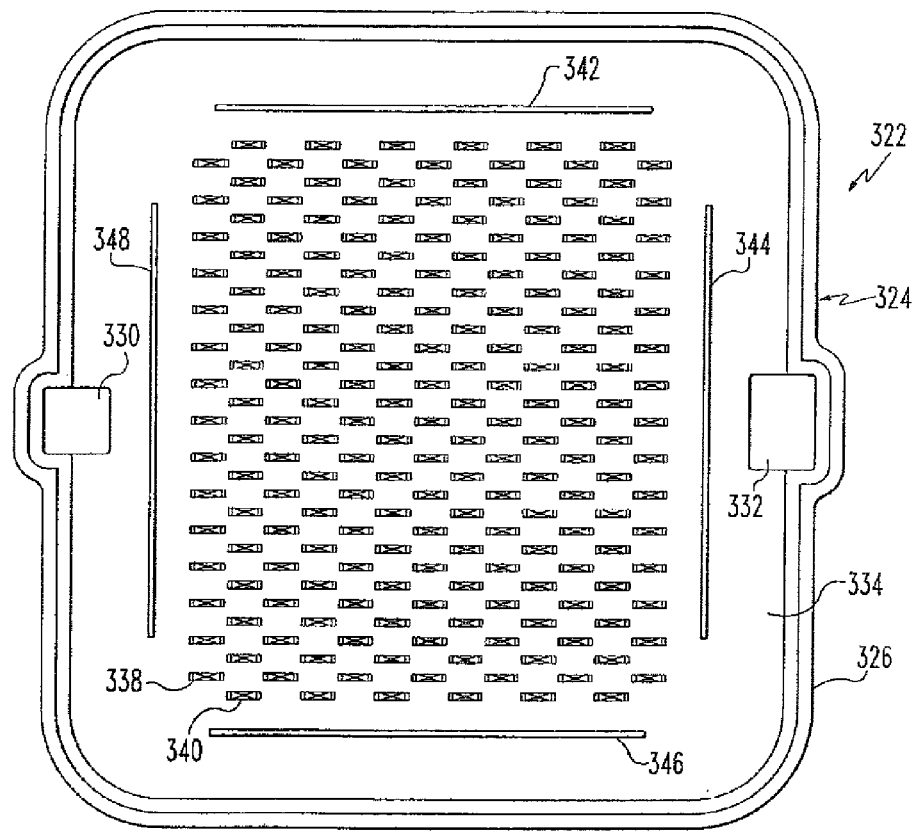
FIG. 21 is a top plan view of the plug element of the third preferred embodiment of a plug connector of the present invention.
Figure 22:
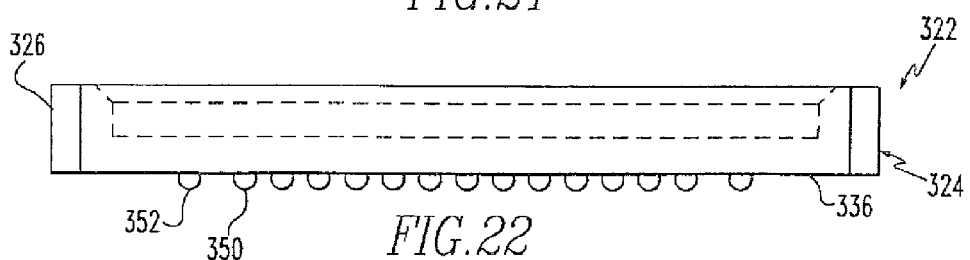
FIG. 22 is an end view of the plug element shown in FIG. 2.

FIGS. 14-18 illustrate a second preferred embodiment of a set of intermating connectors of this invention. Referring particularly to FIGS. 14-15, this set includes a receptacle shown generally at numeral 236. This receptacle includes an insulative housing shown generally at 238 which has an inner side 240, a lateral side 242 and an exterior side 244. The housing also includes opposed alignment projections 246 and 248. On the inner side of the housing there are contacts 250 and 252 each having sections which bow away from each other and then converge to a contact point from which then again diverge. Contacts 251 are mounted on base 231 in the same manner as the embodiments shown in FIGS. 1-13. Solder balls, such as solder ball 254, are mounted to the board side of contacts 250 and 252 in the same manner as described above. Referring particularly to FIGS. 16 and 17, the set also includes a plug shown generally at 258 which includes an insulative housing shown generally at 260 having an inner side 262, a peripheral lateral side 264 and an exterior side 266. At one end of the housing there are a pair of vertical end walls 268 and 270 with a medial end recess 272. At the opposed end of the housing there are another pair of end walls 274 and 276 with a medial end recess 278. Extending from the inner side of the housing there are a plurality of contacts as at contact 280 that extend from recesses as at 282. Onto each of these contacts is fused a solder ball 284. It will also be seen that these contacts are positioned in a staggered arrangement. For example, contact 286 is offset with respect to contact 280, so rows of contacts can be spaced closer together to increase contact density. Referring particularly to FIG. 18, it will be seen that each contact in the plug such as contact 280 is vertically aligned with one of the pairs of converging contacts, such as contacts 250 and 252, in the receptacle and is interposed between these converging contacts. It will also be seen that the alignment projections 246 and 248 also engage the end recesses 272 and 278 in the plug. In this embodiment the separate ground/power contacts used in the FIGS. 1-13 embodiment are not present. Such functions can, if desired, be incorporated into the undivided contacts pairs.

Figure 23:
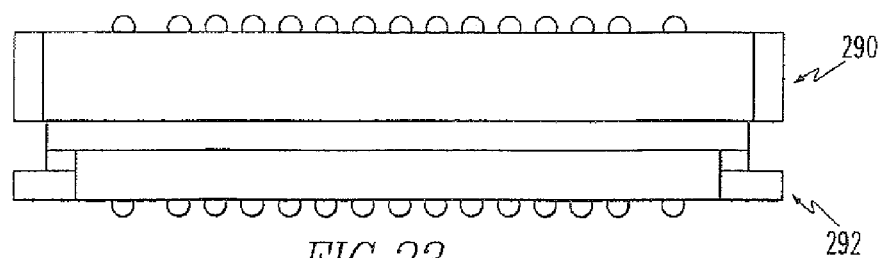
FIG. 23 is an end view of the mated receptacle and plug shown in FIGS. 19-22.

FIGS. 19-23 show a third preferred embodiment of a set of intermating connectors. The plug is shown generally at numeral 290. This plug includes a housing generally 292 having a base wall 294 and a peripheral lateral wall 296, as well as opposed alignment projections 298 and 300. The base wall of the housing has an inner side 302 and an outer side 304. Signal contacts, such as contact 306, extend from inner side 302. It will be seen that the signal contacts are also staggered or offset in alternate rows, to increase contact density. The plug also includes ground or power contacts 310, 312, 314 and 316 arranged adjacent each of the sides of the plug parallel to one side of the lateral wall. On the exterior side of the base wall are signal contact solder balls, such as solder ball 318, and power ground contact solder balls, such as 320, which are fused to their respective contacts in the same way as described with respect to the first embodiment. The receptacle is shown generally at numeral 322 and has an insulative housing 324 that includes a base wall 326, a peripheral lateral wall 328 and alignment projection receiving recesses 330 and 332. The base wall also has an exterior side 334 and an inner side 336. Projecting from the inner side are signal contacts such as contacts 338 and 340. The contacts in adjacent transverse rows are also axially offset to allow an increase in contact density. Parallel to each side of the peripheral wall there are lateral power or ground contacts 342, 344, 346 and 350. On the exterior side of the base wall there are for each signal contact a solder ball, such as solder ball 352. There are also solder balls, such as at solder ball 354, for attaching each of the power or ground pins. Referring to particularly to FIG. 23, it will be seen that at the plug 290 engages receptacle 322.

As previously mentioned, components such as electrical connectors, that are to be mounted on circuit substrates by SMT techniques must meet very demanding specifications for coplanarity. If tight tolerances on coplanarity, usually on the order of about 0.003 to about 0.004 inch, are not maintained, manufacturers experience undesirably high failure rates resulting from faulty solder connections. Variations in the distance of a surface mount portion of a contact from the circuit substrate can result from variations in the location of the contact in the insulative housing occurring as a result of the contact insertion process and from deformation of the housings, resulting in bowing or warping of the mounting interface of the connector body. Connectors made in accordance with the present invention are capable of attaining strict coplanarity requirements by use of features that carefully locate and size the fusible bodies used for bonding the connector to a substrate and by the use of contact securing arrangements that prevent accumulations of stresses in the connector housing that tend to distort the housing.

In the embodiments of FIGS. 1-23 the metal contacts are secured in insulative housings in a manner to avoid the inducing of stress in the body of the housing. This securing is achieved by the use of a shaped slot or opening into which a securing portion of the contact is inserted. In one arrangement especially useful for the smaller signal contacts, the slot has a shape that closely conforms in shape and dimensions to all the surfaces of the contact but one. The wall of the slot facing that one surface has an integrally molded lateral projection projecting into the slot. The distance between the distal end of the projection and the opposing wall of the slot is less than the thickness of the contact. Thus the distal portion of the projection is engaged by and deformed by the contact as it is inserted into the slot. The contact is held securely in the slot by the normal force exerted on the contact by the deformable projection. Because the distal of the projection is free to deform, the build up of stresses in the housing is avoided. In the preferred embodiments illustrated, the projection comprises a pyramidal rib integrally formed on one of the side walls of the slot.

Figure 29:
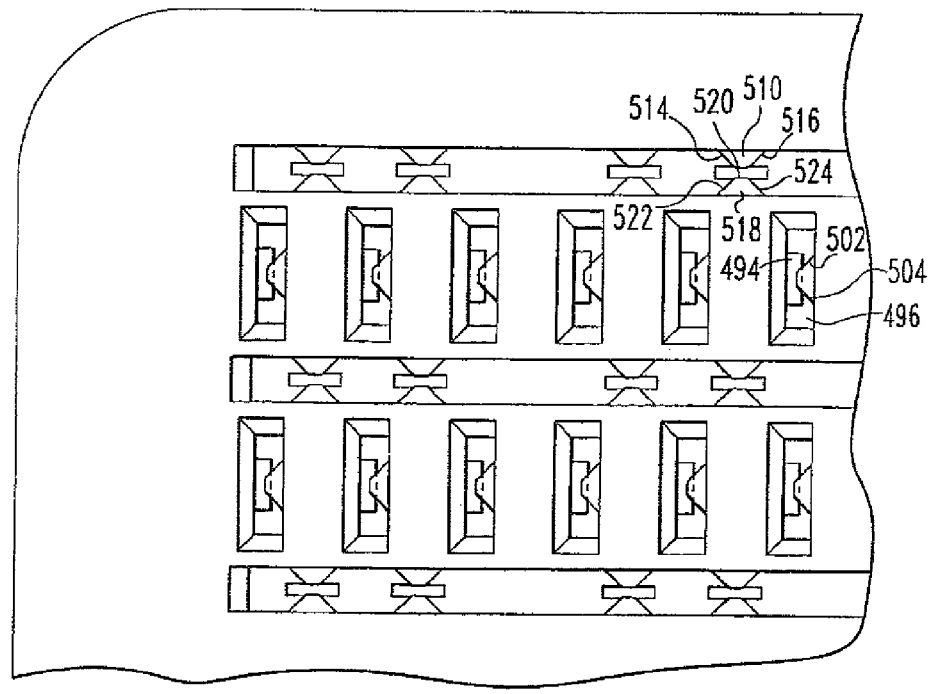
FIG. 29 is a view similar to FIG. 10 in which the ground and power contacts have been omitted.
Figure 30:
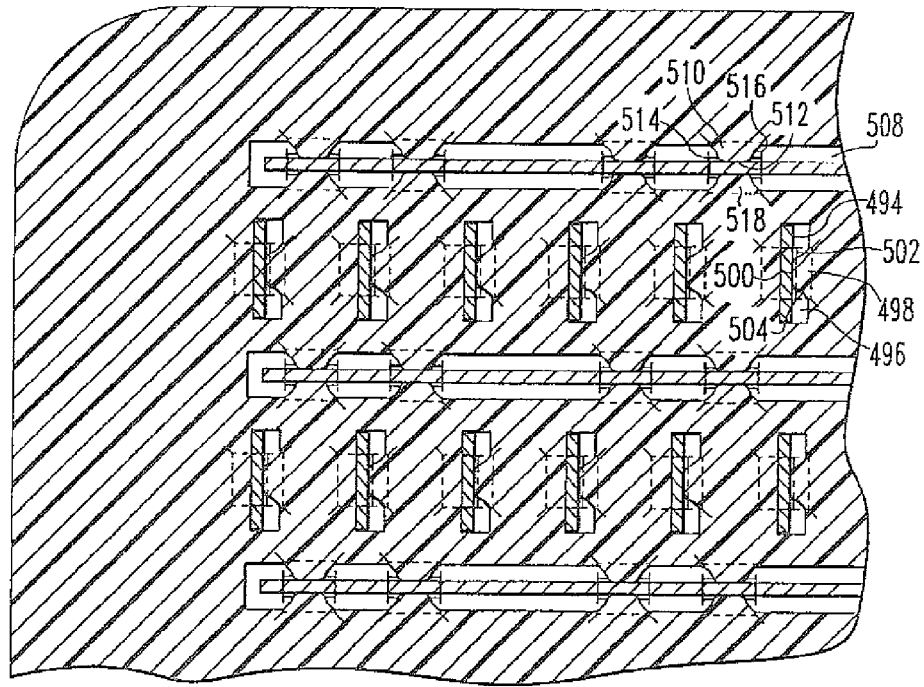
FIG. 30 is a cross sectional view through XXXI-XXXI in FIG. 13.

The specific rib configuration illustrated is believed to be optimum for the particular housings in which it is employed, but other similar ribs of somewhat different shape or size might be advantageously employed with other types of housings. Referring particularly to FIGS. 29 and 30, a signal contact 494 is retained in slot 496 and abuts against rib 498. The rib has a planar surface 500, where it engages the contact 494, and opposed oblique sides 502 and 504. The contact 494 is securely retained in the slot by engagement with the back and side edges of the slot 496 and rib 498. The portion of the rib adjacent surface 500 is free to deform as contact 494 is forced into slot 496, thereby relieving any stresses that result from contact insertion.

Figure 31:
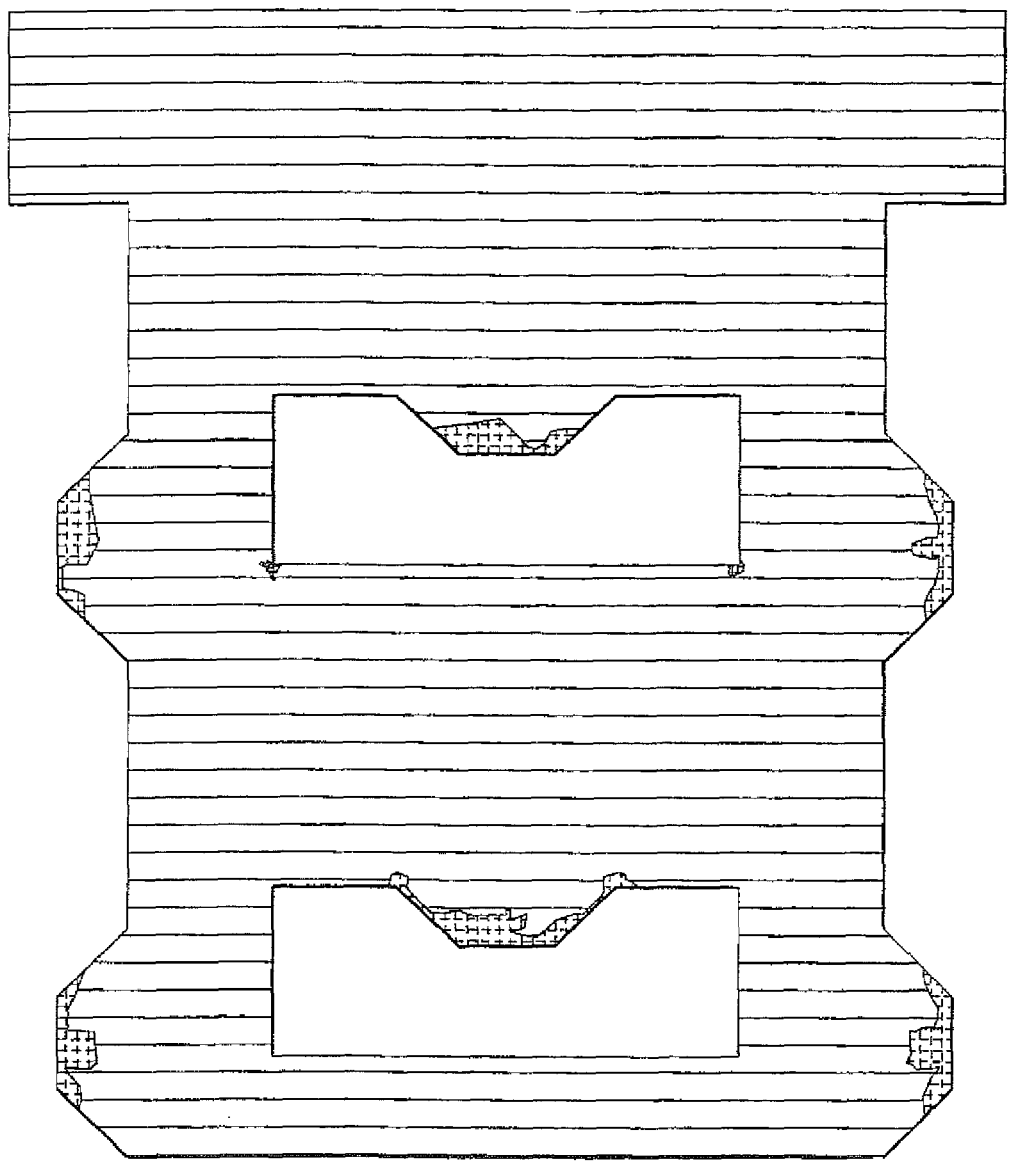
FIG. 31 is a computer generated representation of predicted stresses in an insulative housing similar to those illustrated in the preferred embodiments of the present invention.
Figure 32:
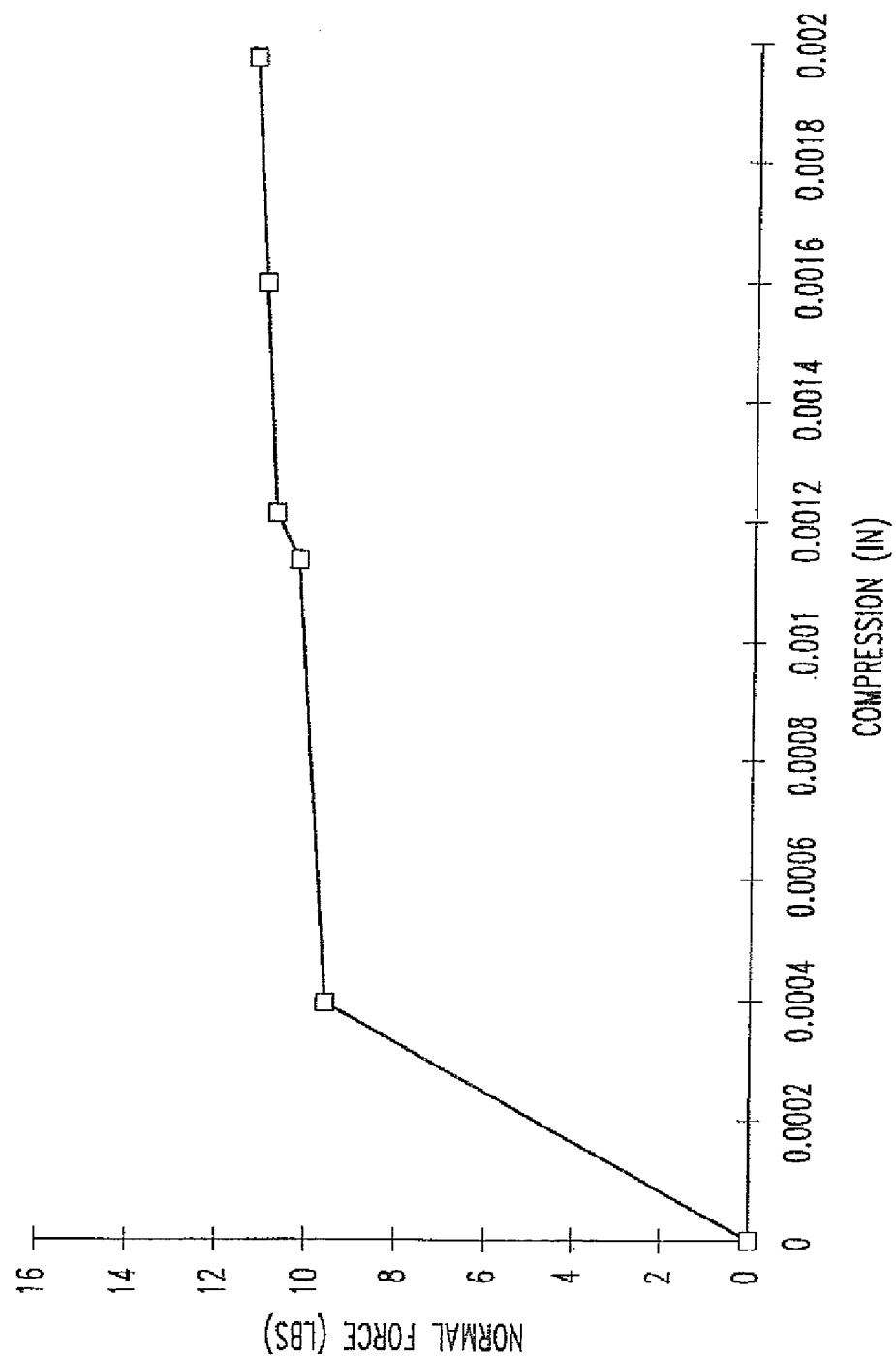
FIG. 32 is a graph of contact retention force as a function of the amount of deformation (compression) in a rib of the insulative housing as is shown in FIG. 29.

Similarly, a power/ground contact is retained in slot 508 and bears against deformable rib 510. The rib has a distal portion 512, where it abuts against the contact, and opposed oblique sides 514 and 516. In this arrangement, there is also an opposed rib as, for example, rib 518. This opposed insulative rib also has a distal portion 520 and oblique sides 522 and 524. The opposed deformable ribs can be used for securing larger contacts and for centering the contact in the slot. Those skilled in the art will also appreciate the particular shape, size, number and placement of such ribs may vary for different types of housings, and these factors would be selected so that, to the greatest extent possible, stresses in the housing are isolated in the deformable ribs. FIG. 31 which was generated using ANSYS stress analysis software available from Ansys, Inc. of Houston, Pa. shows that by use of the contact securing arrangement illustrated in FIGS. 29 and 30, high levels of stress are essentially isolated in the ribs, and do not extend substantially beyond the contact mounting slots thereby significantly reducing the risk of warpage or twisting of the housing which could otherwise result from a large number of contact insertions. The units for the various stress areas shown in FIG. 31 is $N/mm^2$ and the mm is the unit for displacement shown. FIG. 32 shows that, for a typical contact 494, increases in deformation (compression) of the distal portion of the deformable rib up to about 0.0004 inch resulted in an increasing retention force between the contact and the housing, resulting from the normal force imparted on the contact by the rib. After 0.0004 inches of deformation (compression), only minor increases in retention force resulted.

As previously mentioned, another factor influencing coplanarity of the substrate mounting face of a connector utilizing BGA mounting is the unifoimity of the size of the solder balls and the position of the solder balls with respect to the board mounting face of the connector housing. In the preferred embodiments previously described, the termination tab of each contact is positioned in a recess. The outer recesses are substantially uniform in size and shape. These recesses provide several features of importance with respect to the present invention. The recesses can receive a highly uniform amount of solder paste placed therein, for example, by a simple deposit and squeegee operation. Thus the amount of solder available for securing each solder ball onto a contact ubstantially uniform. The recesses locate the position of each solder ball in the lateral X-Y directions prior to attachment of the solder balls onto the contacts. The recesses also locate the solder balls in the Z direction with respect to the bottom surface of the housing and the distance of the solder ball from the terminal tabs of the contacts. The nominal extension of the tab into the recess is set so that at the maximum of the tolerance for extension of the tab into the recess, the tab does not touch the solder ball and thereby influence its Z direction location. However, fusing of the solder ball onto the contact tab is assured by having a relatively uniform and adequate amount of solder, from the solder paste, in the recess. Any variation in the distance between the contact tab and the solder ball is absorbed by the variable volume of solder paste placed in the recess.

Figure 33:
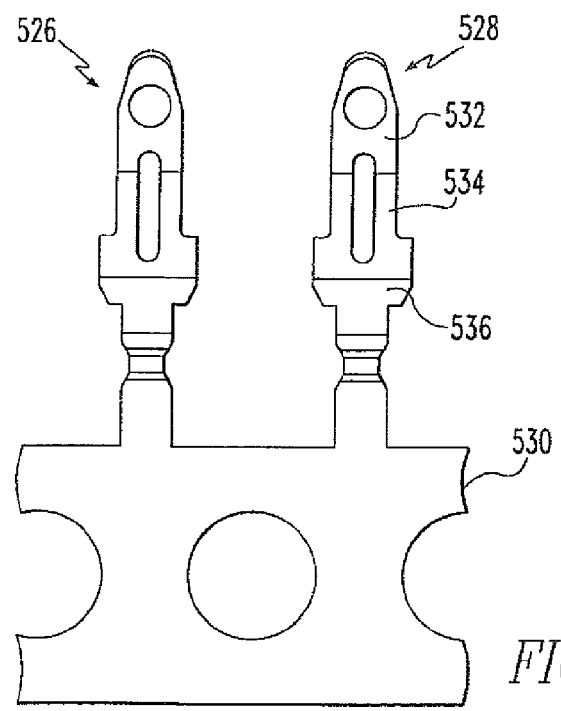
FIG. 33 is a front elevational view of a receptacle signal contact used in a preferred embodiment of the connector of the present invention.
Figure 34:
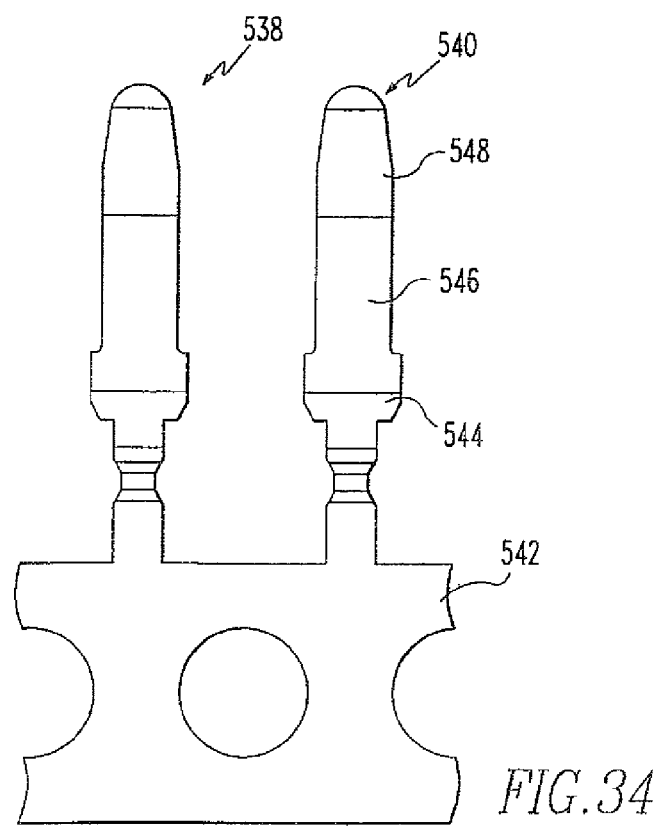
FIG. 34 is a front elevational view of a plug signal contact used in a preferred embodiment of the connector of the present invention.
Figure 35:
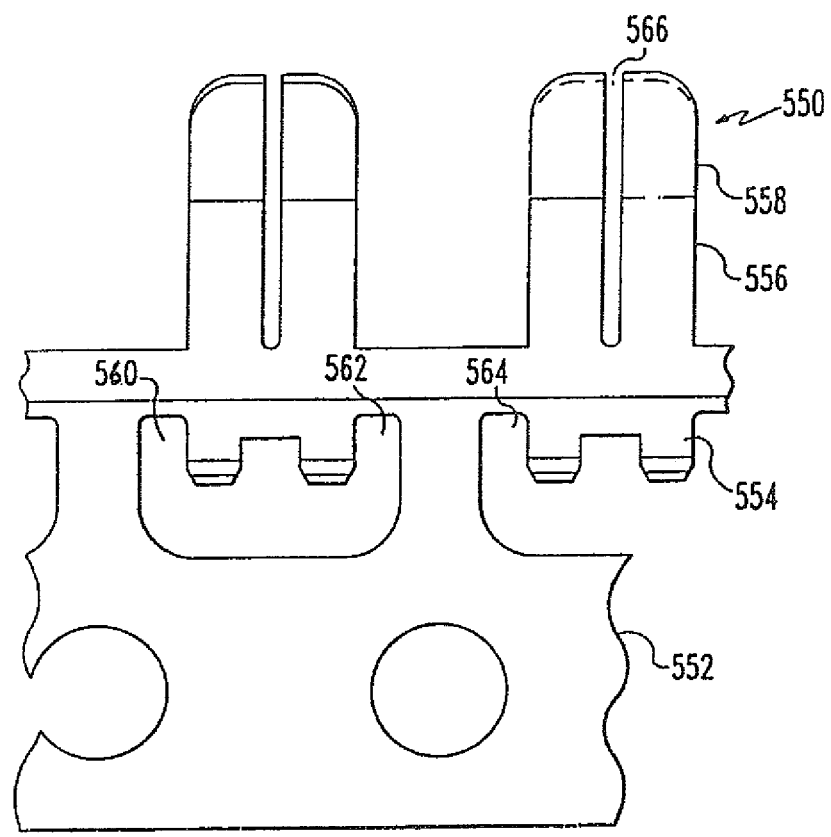
FIG. 35 is a front elevational view of a receptacle ground/power contact with carrier strip used in a preferred embodiment of the connector of the present invention.
Figure 36:
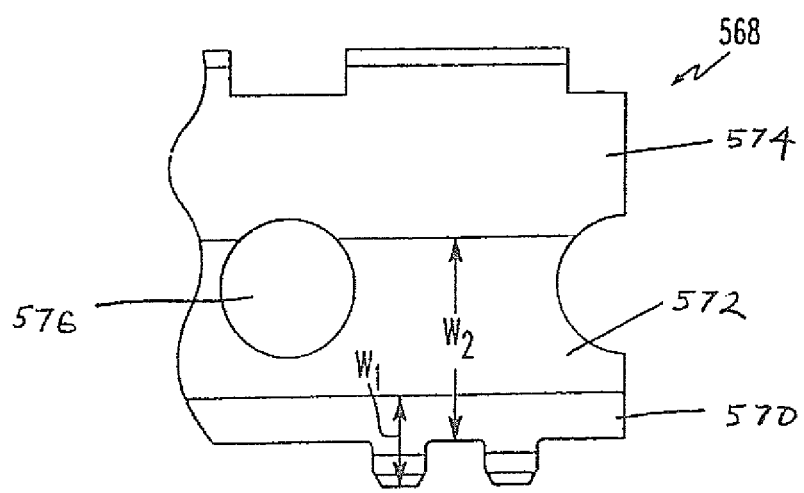
FIG. 36 is a front elevational view of a plug ground/power contact with carrier strip used in a preferred embodiment of the connector of the present invention.

In order to maintain an adequate amount of solder adjacent the solder ball during the reflow step used to attach the solder balls onto the contacts and to prevent solder wicking onto the engagement surfaces of the contact, the contact is treated to resist solder wicking. Referring particularly to FIG. 33, contacts 526 and 528 are shown attached to a carrier strip 530. The contacts have a contact engagement area 532 usually plated with non-oxidizing metals such as gold, palladium or alloys of palladium. The contacts also have a central area 534, a portion of which forms the contact retention area in the housing. An anti-solder wicking or non-solder wettable material is applied to the central area 532. One preferred material for this purpose is nickel plating. While not intending to be bound by any particular theory, it is believed that the solder resistant feature of this nickel plated area results from or is enhanced by the oxidation of the nickel after plating, for example, by exposure to ambient air for several days. Surprisingly and unexpectedly, it is found that the nickel or nickel oxide barrier prevents or reduces solder wicking in such contacts. For the nickel or nickel oxide plating to have such a passivation function, it is preferred that the plating have a thickness of from 10 μin to 100 μin and more preferably about 50 mm. Other solder wick resistant materials are believed to be usable for this purpose, such as flourine containing solder resist coatings. These may be especially useful if the entire contact is plated with a continuous outer layer of a solder wettable metal, for example, gold. The contact tab area 536 may preferably be plated with a solder receptive material such as gold, tin or tin alloys. Preferably the entire contact will be plated with nickel. On the upper section there is a precious metal layer selectively plated over the nickel. This upper section precious metal plating will preferable have a thickness of from 10 μin to 100 μin and more preferable 30 μin. On the lower section there is a solder wettable metal layer selectively plated on the lower section. Alternatively, an electroplated layer of chromium can be substituted for the nickel layer. Referring to FIG. 34, plug signal contacts 538 and 540 are shown attached to a carrier strip 542. Each of these contacts has a gold plated tab area 544, a nickel plated central retention and anti-wicking area 536 and a precious metal plated engagement area 548. Similarly in FIG. 35, the ground/power contact 550 is shown attached to carrier strip 552. This contact has a lower gold plated tab area 554, a nickel plated central anti-wicking area 556 and an upper gold plated contact engagement area 558. Another feature of ground/power contact 550 which is also found to reduce wicking is a series of notches in the tab area 554 such as notches 560, 562 and 564. Another feature of ground/power contact 550 which was included in embodiments disclosed above is vertical slots such as slot 566. Referring to FIG. 36, a plug ground/power contact 568 is shown which has a lower gold plated tab area 570, a nickel plated central anti-wicking area 572 and an upper gold plated area 574. It will be seen that ground/power contact 568 does not have a separate carrier strip, but it does have apertures such as aperture 576 which allow the contact itself to serve this carrier function. With each of the contacts described above it will be understood that tin or other solder wettable material may be substituted for gold in the lower area. For all the contacts shown in FIGS. 33-36 the width of the lower gold plated tab area as is, for example, shown at $w_1$ in FIG. 36 will preferably be from about 0.1 mm to about 0.25 mm. The width of the nickel plated central area as is shown, for example, at $w_2$ in FIG. 36 will preferably be from about 0.1 mm to about 1 mm.

Figure 24:
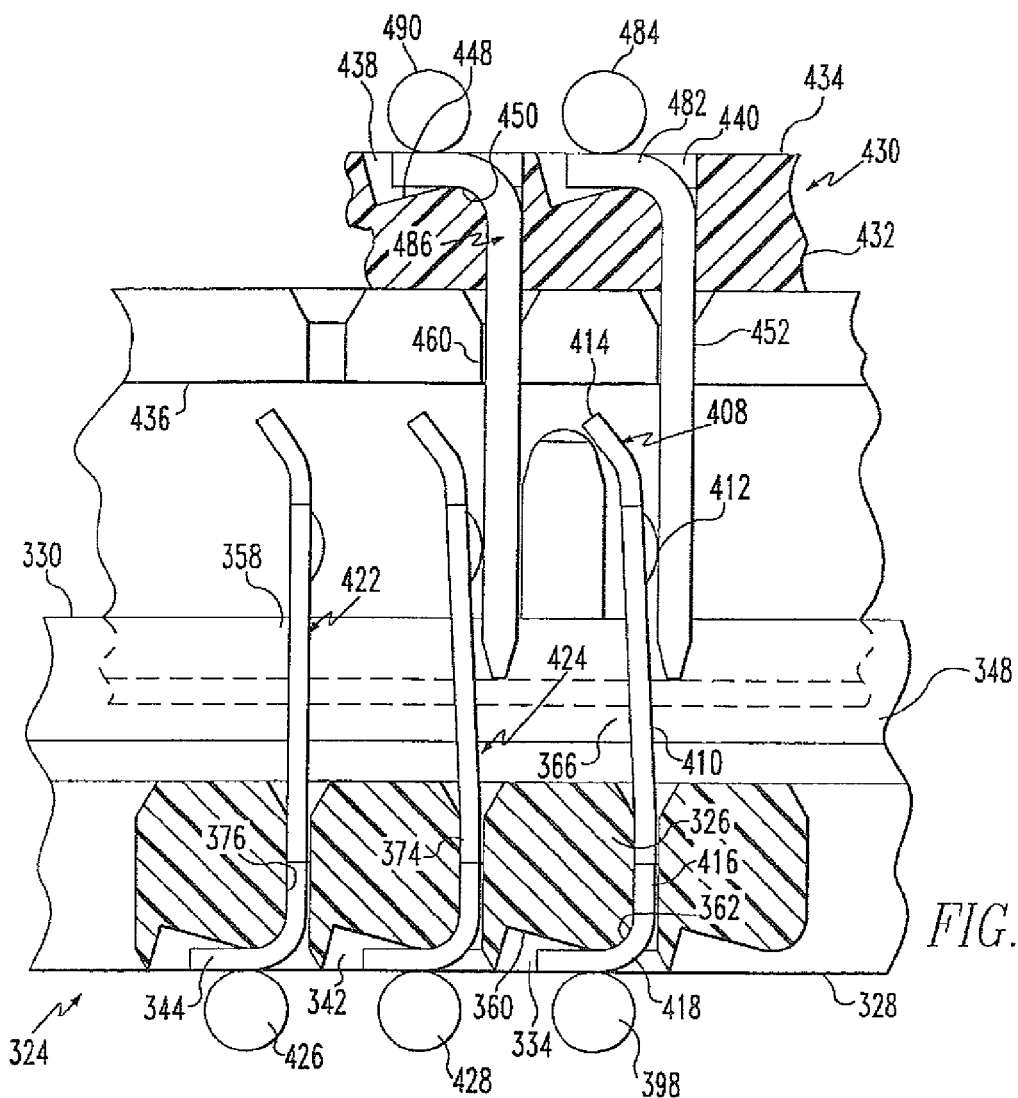
FIG. 24 is a side cross sectional view in fragment of another embodiment of a connector according to the present invention.
Figure 25:
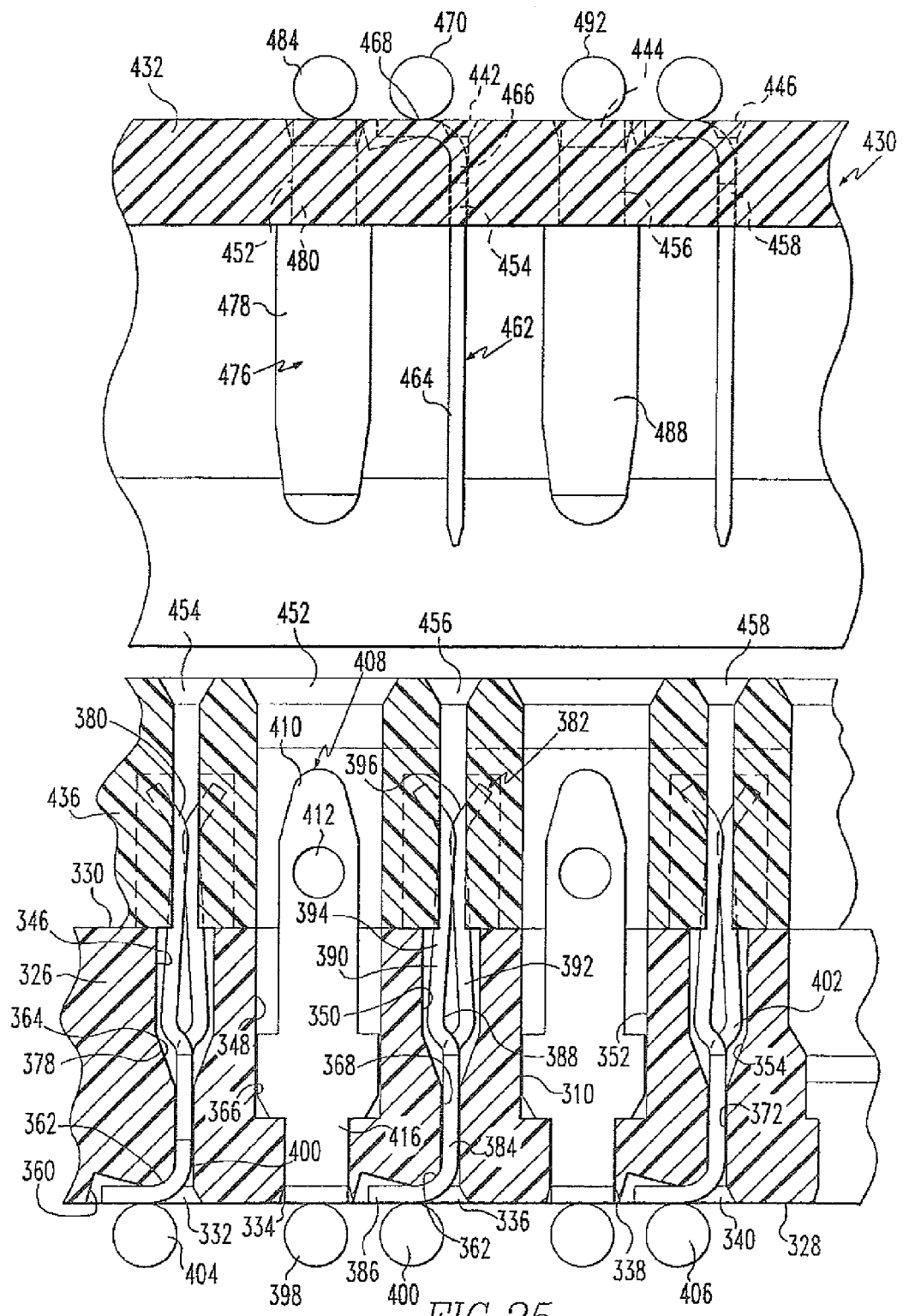
FIG. 25 is a front cross sectional view in fragment of the connector shown in FIG. 24 in which the plug and receptacle are unmated.

Referring to FIGS. 24-25, an embodiment of the invention having another arrangement for affixing solder balls is shown. The receptacle of this connector is shown generally at numeral 324. This receptacle has a base wall 326 having an exterior side 328 and an interior side 330. On the exterior side there are recesses such as at recesses 332, 334, 336, 338, and 340, (FIG. 25) 342 and 344 (FIG. 24). Each of these recesses preferably has an oblique base wall 360 having a rounded surface 362. On the interior side 330 there are recesses as at recess 346, 348, 350, 352, 354 (FIG. 25), 356 and 358 (FIG. 24). Between the exterior and interior recesses there are medial slots as at slot 364, 366, 368, 370, 372 (FIG. 25), 374 and 376 (FIG. 24). Each of these slots has a retention projection (not shown) for retaining the contact in the slot, in a manner substantially the same as that previously discussed in connection with FIGS. 29 and 30. On the interior side, the receptacle has substantially the same construction as the receptacle illustrated in FIGS. 1 and 2. It includes an upper section 436 secured on base 326 in a suitable manner, preferably by latches (not shown) as discussed with respect to FIGS. 1 and 2. The upper section or cover 436 has a plurality of openings, such as openings 452 and 460, for receiving individual contacts from a mating plug or slots, such as slots 454, 456, 468 (FIG. 25) for receiving ground or power contacts from the mating plug. The signal contacts, such as contact 408, and ground/power contacts are of a form substantially as described with respect to any of the previous described embodiments. For example, the ground contact 382 (FIG. 25) has a lower section 384 from which there is a tab 386. This contact also has an upper section shown generally at numeral 388 which is made up of forks 390 and 392. Each of these forks has a converging section 394 and an outwardly diverging lead-in section 396. The tab 386 is located in recess 336. Each signal contact, such as contact 408, has an upper section 410 with a forward projection 412 and rearward bend 414. The signal contact also has a medial section 416 where it engages the insulative housing and a lower tab 418 located in recess 334.

Figure 24A:
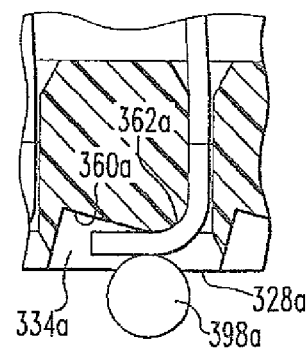
FIG. 24a is a fragmentary view of a portion of the structure of FIG. 24 modified to form a deeper recess.

The tab 386 of ground contact 382 and the tab 418 of signal contact 408 are formed by bending the tail portions of the respective terminals about the surfaces 362, after the contacts are inserted into base 326. Each surface 362 serves as bending mandrel for an associated contact tail. The tails are bent to the extent of the oblique surface 360 and are allowed to spring back so that the tabs are transverse to the longitudinal axis of the contact and are substantially parallel to the surface 328. This assures a high degree of coplanarity of the tabs. Subsequent to formation of the tabs, solder paste is applied to the outside surface of each tab. Solder balls, such as 398, 400, 402, 404, 406 (FIG. 25), 426 and 428 (FIG. 24) are then applied to the tabs and the assembly is heated to fuse the solder paste and solder ball onto each tab. In an alternative structure, shown in FIG. 24a, the recess 334a are deepened so that surfaces 360a and 362a are positioned further from bottom surface 328a. As a result, the solder ball 398a is located partially within the recess 334a and is stabilized by the edges thereof, as previously discussed especially with respect to FIGS. 12 and 13. As a result, when solder balls of highly uniform size are used, these arrangements can yield finished connectors that exhibit coplanarity of the contacts across the mounting interface.

A plug having generally the same construction as the plugs previously described is shown generally at numeral 430. It includes a base wall 432 having an exterior side 434 and an interior side 436. On the exterior side there are recesses as at recess 438, 440, 442, 444 and 446. Each of these recesses has an oblique base wall 448 and a curved wall 450. Connecting with each of these recesses are contact slots 452, 454, 456, 458 and 460. The plug also has a number of power/ground contacts as, for example, is shown generally at numeral 462. Each of these contacts has a contact section 464 that engages the forks of the ground/power contacts of the receptacle. These contacts also have a medial section 466 where it engages the housing and a solder ball tab 468 for receiving a solder ball 470. The plug also includes a number of signal contacts as, for example, is shown generally at numeral 476. Each of these signal contacts includes a contact section 478 which engages the signal contacts in the receptacle, a medial section 480 where it engages the housing and a solder ball tab 482 for receiving a solder ball. Other signal contacts as at 486 and 488 engage respectively other solder balls as at 490 and 492. The older ball tabs are formed and solder balls 470, 474, 484, 490 and 492 are applied to the plug in substantially the same manner as previously described with respect to the receptacle.

In the method of this invention the conductive element will preferably be a solder ball. Those skilled in the art, however, will appreciate that it may be possible to substitute other fusible materials which have a melting temperature less than the melting temperature of the insulative body. The fusible element can also have a shape other than a sphere. The solder ball or other conductive element will also preferably have a diameter which is from about 50 percent to 200 percent of the width of the recess. This diameter will also preferably be related to the depth of the recess and be from 50 percent to 200 percent of that depth. The volume of the solder ball will preferably be from about 75 percent to about 150 percent of the volume of the recess and, more preferably, will be about the same volume as the recess. The contact tab will extend into the recess by a sufficient amount to present adequate surface area for the solder ball to fuse to, and will usually preferably extend into the recess from about 25 percent to 75 percent and more preferably to about 50 percent of the depth of the recess as previously mentioned. The recesses ordinarily will be circular, square or the shape of any other regular polygon in cross section. When the conductive element is solder, it will preferably be an alloy which is in the range of about 90% Sn and 10% Pb to about 55% Sn and 45% Pb. More preferably the alloy will be eutectic which is 63% Sn and 37% Pb and has a melting point of 183° C. Typically, a "hard" solder alloy with a higher lead content would be used for mating to materials such as ceramics. The "hard" solder ball will "mushroom" or deform slightly as it softens under typical SMT conditions, but will not melt. A "soft" eutectic ball is used for attachment to PCB's and will usually reflow and reform itself under typical SMT conditions. Other solders known to be suitable for electronic purposes are also believed to be acceptable for use in this method. Such solders include, without limitation, electronically acceptable tin-antimony, tin-silver and lead-silver alloys and indium. Before the solder ball or other conductive element is positioned in a recess, that recess would usually be filled with solder paste.

Alternatively, in place of the solder ball previously described, a body of material which is not fusible at SMT temperatures may be attached by reflow of the solder paste in the recesses onto the contacts. The connector mounting interface would comprise a plurality of infusible spheres in a tightly coplanar array. Such a connector would be secured on a substrate by conventional SMT techniques.

While it is believed that a solder paste or cream incorporating any conventional organic or inorganic solder flux may be adapted for use in this method, a no clean solder paste or cream is preferred. Such solder pastes or creams would include a solder alloy in the form of a fine powder suspended in a suitable fluxing material. This powder will ordinarily be an alloy and not a mixture of constituents. The ratio of solder to flux will ordinarily be high and in the range of 80%-95% by weight solder or approximately 80% by volume. A solder cream will be formed when the solder material is suspended in a rosin flux. Preferably the rosin flux will be a white rosin or a low activity rosin flux, although for various purposes activated or superactivated rosins may be used. A solder paste will be formed when a solder alloy in the form of a fine powder is suspended in an organic acid flux or an inorganic acid flux. Such organic acids may be selected from lactic, oleic, stearic, phthalic, citric or other similar acids. Such inorganic acids may be selected from hydrochloric, hydroflouric and orthophosphoric acid. Cream or paste may be applied by brushing, screening, or extruding onto the surface which may advantageously have been gradually preheated to ensure good wetting. Although it has been found that wicking of the solder onto the contact is significantly reduced when a solder paste or cream is used, it is believed that paste type solder flux alone may also be used when a suitable, passivation agent is used. Such a suitable passivation agents would include fluoride containing solder resist coatings such as FLOURAD which is available from the 3M Corporation.

Heating is preferably conducted in a panel infra red (IR) solder reflow conveyor oven. The solder element would ordinarily be heated to a temperature from about 183° to about 195° C. but, depending on the material of the housing, solders having melting temperatures may be used. The conveyor oven would preferably be operated at a rate of speed from about 10 to 14 inches per second and would be moved through a plurality of successive heating phases for a total time of about 5 minutes to about 10 minutes. Prior to being inserted into the conveyor oven the connector housing, contacts and solder elements may be preheated at an elevated temperature for at least an hour. In the conveyor oven a temperature profile would be developed based on an appropriate peak temperature, maximum slope and time above reflow temperature. Peak temperature is the highest temperature reached by the housing. For a solder element with a melting point of 183° C., peak temperature would usually be between 185° C. and 195° C. Maximum slope is measured in ° C./sec. and specifies how fast the connector housing temperature is allowed to change, so as to avoid warping or bending. For most applications of this method, maximum positive slope will preferably initially be from about 2° C./sec to 15° C./sec. After the wetting point of the solder is reached negative slope will preferably be −2° C./sec to −15° C./sec. An important aspect of the method of this invention is that time above reflow is minimized. Time above reflow is a measure of how long the solder element remains in its liquid phase. It is found that when time of the solder in its liquid phase is minimized, wicking of solder from the recess up the contact is eliminated or significantly reduced. Preferably rise time of temperature as measured on the board between 180° C. and 200° C. and fall time of temperature as measured on the board between 200° C. and 180° C. will both be from about 10 seconds to about 100 seconds. While not intending to be bound by any particular theory, it is believed that during such relatively short periods of time, surface tension of the liquid solder element will restrain the liquid solder from flowing through the contact receiving slot in the base of the recess. After such periods of time, however, the liquid solder will begin to flow through the contact receiving slot and wick up the contact. Prior to bringing the temperature of the solder element to its melting temperature, it may also be advantageous to initially have a relatively high slope but before melting temperature is reached to slow the rate of temperature increase or decrease after which a relatively high slope is then adopted until the melting temperature is reached. The selection of an appropriate housing material may also enhance results. Preferably the housing material will be wholly aromatic liquid crystal polyester (LCP) with characteristics of high glass transition temperature, low thermal coefficient, low moisture absorption, high fracture toughness, good flow and low viscosity, high temperature and high flash point.

The method of the present invention is further described with reference to the following examples.

Example 1

An insulative housing for a connector plug and receptacle substantially is described above in connection with FIGS. 1-18 was made. Contacts also substantially in accordance with that description were also positioned in the housing. These contacts were beryllium copper and were plated with gold over their entire surface area to a thickness of 30 microns. The housing material was DUPONT H6130 liquid crystal polymer (LCP). The length and width of the plug were respectively 52.5 mm (including mounting brackets) and 42.36 mm. The recesses on the exterior surfaces of the plug and receptacle housing were cross sectionally square having a side dimension of 0.62 mm and a depth of 0.4 mm. About 2 mm of the contact extended into the recess. Other dimensions were generally in proportion to the above dimensions in accordance with FIGS. 1-18. On the exterior sides of both the plug and receptacle the recesses were filled or substantially filled with CLEANLINE LR 725 no clean solder cream which is commercially available from Alphametals, Inc. of Jersey City, N.J. Both the plug and receptacle were turned over on their exterior sides on a quantity of spherical solder balls so that a solder ball became embedded in each of the recesses. The solder balls used were ALPHAMETAL no flux 63SN/37PB spherical solder balls which had a diameter of 0.030 inch±0.001 inch and a weight of approximately 0.00195 g. The plug and receptacle were then treated with FLUORAD, a solder anti-wicking material available from 3M Corporation. After such treatment the plug and receptacle were then dried in a convection oven for 2 hours at 105° C. The plug and receptacle were then positioned on separate circuit boards made of conventional reinforced epoxy printed circuit board material, having thicknesses of 0.061 inches. Referring to FIG. 9, a thermocouple was placed on the exterior surface of the plug in position T. Another thermocouple was centrally positioned upon the supporting board surface adjacent the plug. Both the plug and the receptacle were then treated in a panel-infrared (IR) conveyer solder reflow oven.

As is conventional for this type of oven, the plug and receptacle were moved through six zones in the reflow oven. The conveyor speed was 13 in/min. Heating temperatures in each zone are shown in Table 1. Minimum and maximum temperatures for the plug and for the supporting board are shown in Table 2. Both positive and negative maximum slopes are shown in Table 3. Rise time and fall time measured on the board between 180° C. and 200° C. are shown in Table 4. Temperature by time and distance for the plug is shown in the curve in FIG. 26a wherein the heavy line is the temperature at the thermocouple on the supporting board and the light line is temperature at the thermocouple on the plug exterior surface. A visual inspection of the plug and the receptacle after solder reflow showed that nearly all the solder balls had fused to the contact leads in their respective cavities. Solder ball height above the exterior surfaces of the plug and the receptacle also appeared to be relatively uniform. There was no noticeable warping or bending of the housing.

Example 2

Another plug and receptacle were prepared in essentially the same way as was described in Example 1 and solder balls were emplaced in the recesses on the exterior sides. Several hours after the treatment in the solder reflow oven in Example 1, when atmospheric conditions were somewhat different, another plug and receptacle essentially similar to the ones used in Example 1 were subjected to similar reflow heating as were used in Example 1. Oven conditions are shown in Table 1. Minimum and maximum temperatures of the plug and the adjacent supporting board are shown in Table 2. Both positive and negative maximum slope is shown in Table 3, rise time and fall time measured on the board between 180° C. and 200° C. is shown in Table 4. Temperature by time and distance is shown in FIG. 26b. It will be seen that the curve shown in FIG. 26b is somewhat different than that shown in FIG. 26a which difference is attributed to different ambient atmospheric conditions. A visual inspection of the resulting connector showed similar results to those achieved in Example 1.

TABLE 1

Temperature (° C.)

| Example | ZONE | #1 | #2 | #3 | #4 | #5 | #6 |
|---------|-------|---------|----------|-----|-----|-----|----------|
| 1 | UPPER | 350 | Unheated | 275 | 230 | 310 | Unheated |
| 1 | LOWER | Unheated | Unheated | 275 | 230 | 310 | Unheated |
| 2 | UPPER | 350 | Unheated | 275 | 230 | 310 | Unheated |
| 2 | Lower | Unheated | Unheated | 275 | 230 | 710 | Unheated |

TABLE 2

| | Connector | | Board | |
|---|---|---|---|---|
| Example | Max Temp (° C.) | Time (Min. & Sec.) | Max Temp (° C.) | Time (Min & Sec) |
| 1 | 188 | 4:37.6 | — | — |
| 1 | — | — | 232 | 4:19.8 |
| 2 | 191 | 4:53.2 | — | — |
| 2 | — | — | 229 | 5:10.4 |

TABLE 3

Positive and Negative Maximum Slope ° C. (Sec)

| | Connector | | Board | |
|---|---|---|---|---|
| Example | Max | Time Reached (Min & Sec) | Max | Time Reached (Min & Sec) |
| 1 | +2 | 0:50.4 | +2 | 0:30.4 |
| 1 | −2 | 6:45.2 | −3 | 5:58.8 |
| 2 | +3 | 7:08.0 | +3 | 1:14.8 |
| 2 | −15 | 6:13.8 | −7 | 6:14.0 |

TABLE 4

Rise Time and Full Time Between 180° C. and 200° C. (Measured on Board)

| Example | Rise Time (Min & Sec) | Fall Time (Min & Sec) |
|---|---|---|
| 1 | 0:28.8 | 0:15.2 |
| 2 | 1:31.6 | 0:40.6 |

Example 3

Figure 26A:
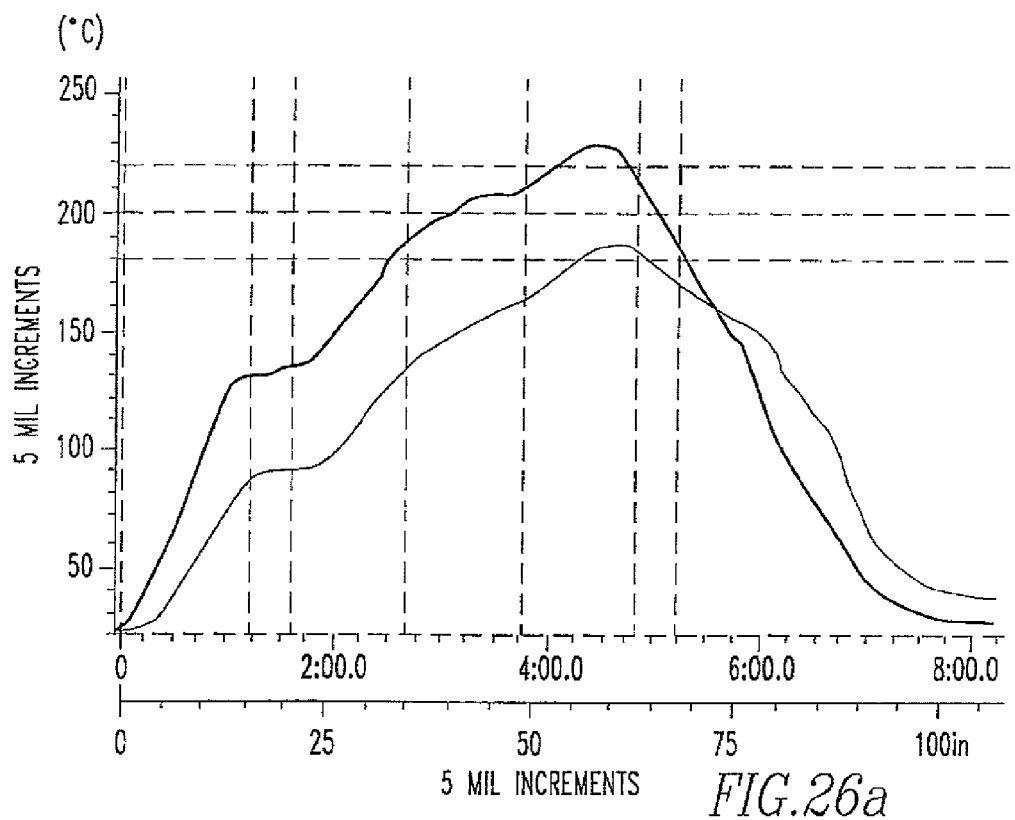
FIGS. 26a and 26b is a graph showing temperature versus time and distance during solder reflow in Examples 1 and 2 of the method of the present invention.
Figure 26B:
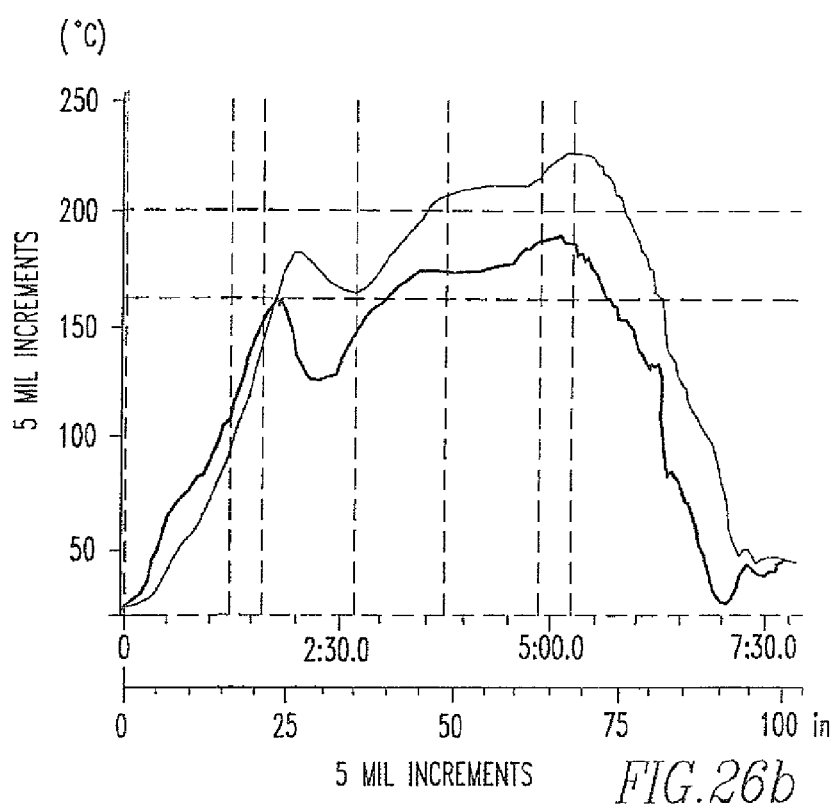
Figure 27A:
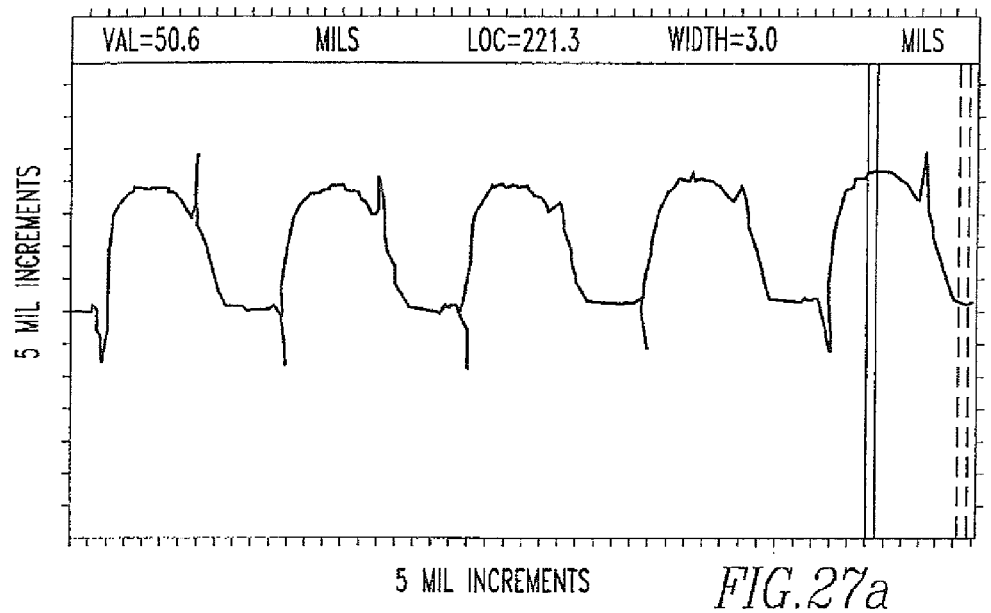
FIGS. 27a-27f are laser generated profiles of the product of Example 3 of the method of the present invention.
Figure 27B:
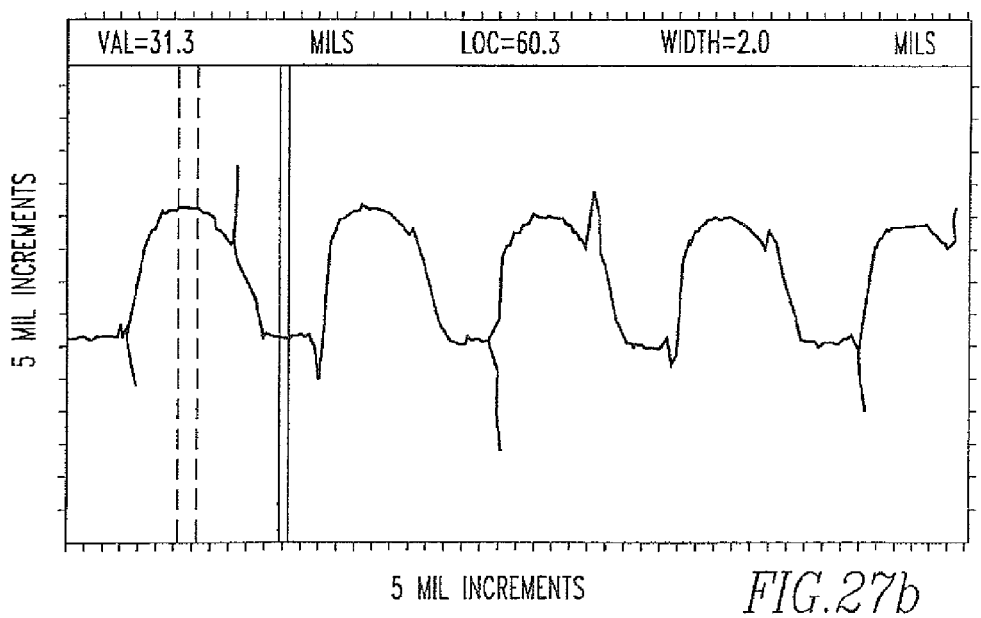
Figure 27C:
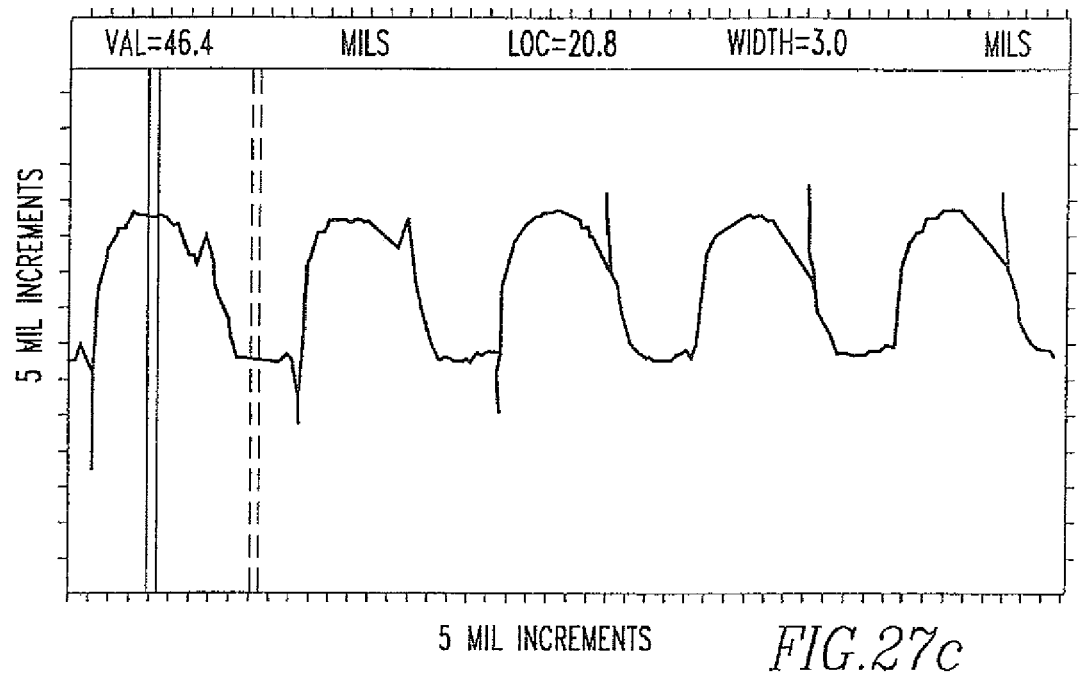
Figure 27D:
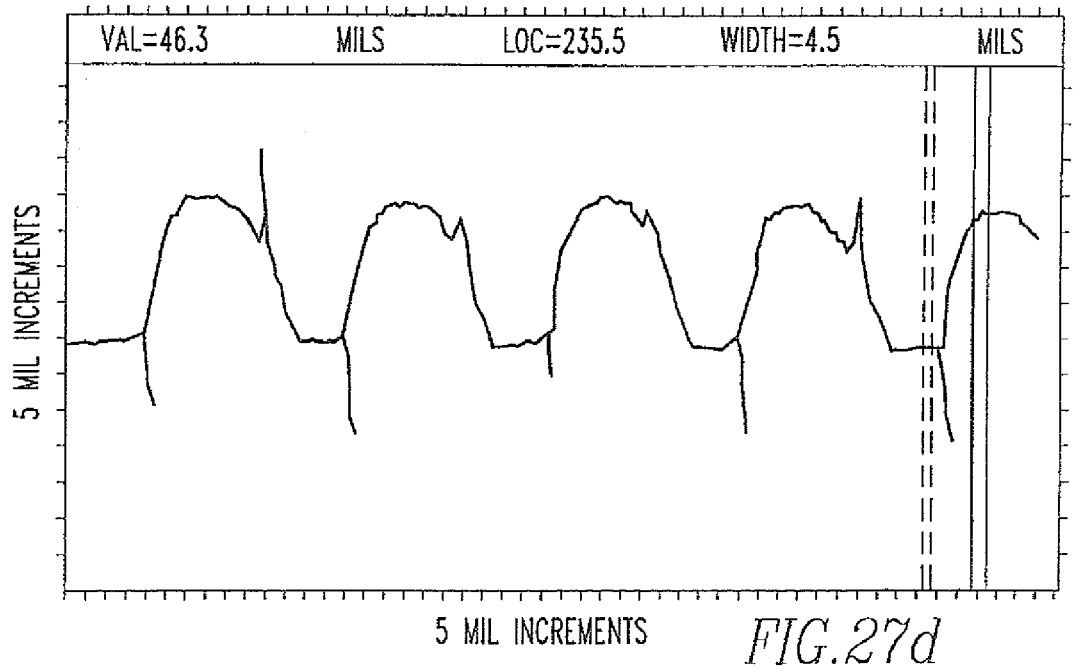
Figure 27E:
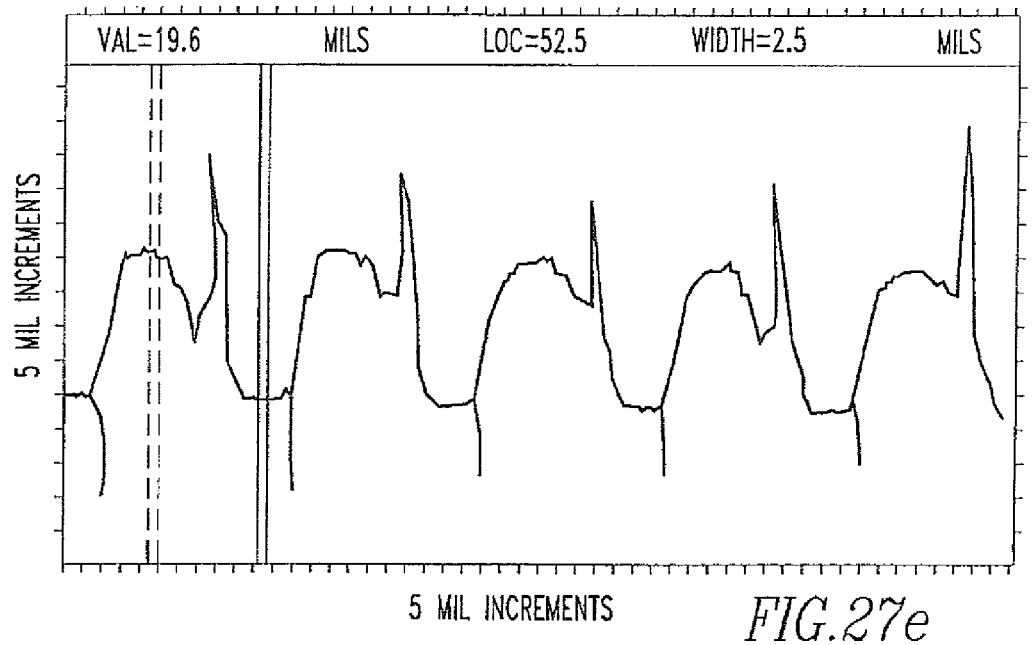
Figure 27F:
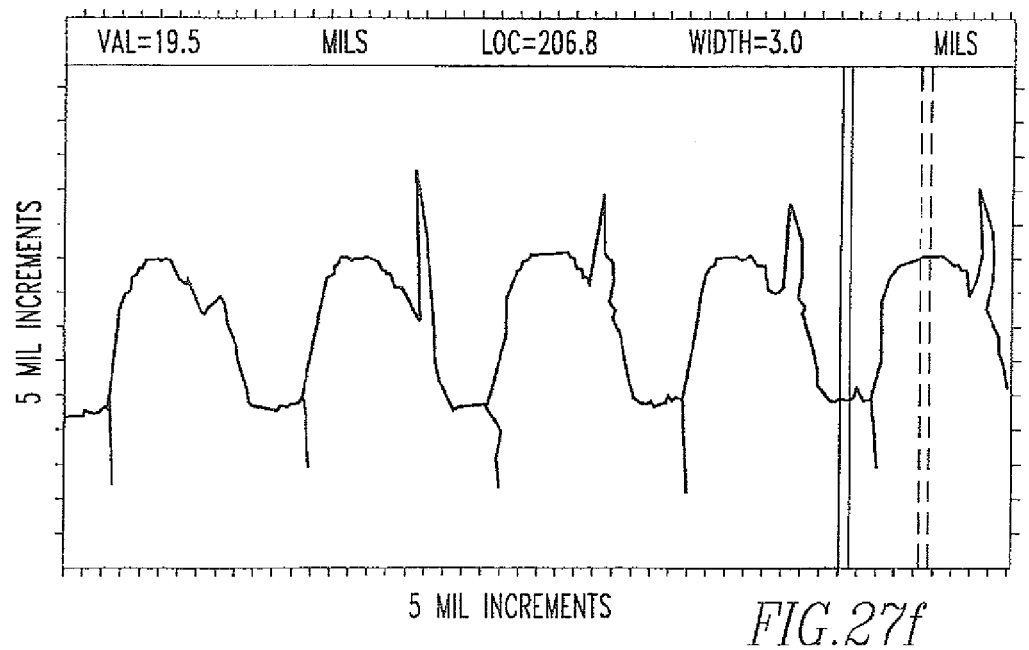

Another connector was made using essentially the same conditions as were described in Examples 1 and 2 except that the specific curves shown in FIGS. 26a and 26b may have been somewhat different because of atmospheric conditions. After the completion of this connector, the solder balls at six locations on the exterior surface of the plug were examined by Laser Point Range Sensor (PRS) available from Cyber Optics Corporation of Minneapolis, Minn. Referring to FIG. 9, these locations are identified as areas 27a and 27b when the laser was directed from $L_1$, as areas 27c and 27d when the laser was directed from $L_2$ and as areas 27e and 27f when the laser was directed from $L_3$. At all these areas a laser profile was taken of the profiles of the five solder balls in each of these areas. Reproductions of these laser profile are shown in FIGS. 27a-27f. The height of each of these solder balls at its highest point above the plane of the exterior side of the plug is shown in Table 3. For each of these groups the solder ball closest to the front of the plug as shown in FIG. 9 was considered the first position in Table 5 and was the solder ball on the left of the graphs in FIGS. 27a-27f. An examination of these results reveals that in each group of five solder balls there was what was considered to be an acceptable degree of uniformity for the height of the solder balls.

TABLE 5

POSITION HEIGHT (.001 in.)

| GROUP | 1 | 2 | 3 | 4 | 5 |
|---|---|---|---|---|---|
| 27a | 18.1 | 18.9 | 19.5 | 19.6 | 19.1 |
| 27b | 19.2 | 18.5 | 17.6 | 18.5 | 18.0 |
| 27c | 20.4 | 21.1 | 21.6 | 21.1 | 21.4 |
| 27d | 19.9 | 20.1 | 20.1 | 21.2 | 20.5 |
| 27e | 18.2 | 18.9 | 19.3 | 18.2 | 18.7 |
| 27f | 19.1 | 18.2 | 19.0 | 18.2 | 18.9 |

Example 4

Another connector was made essentially according to the conditions described in Examples 1 and 2 except because of atmospheric conditions the specific curves shown on FIGS.

Figure 28A:
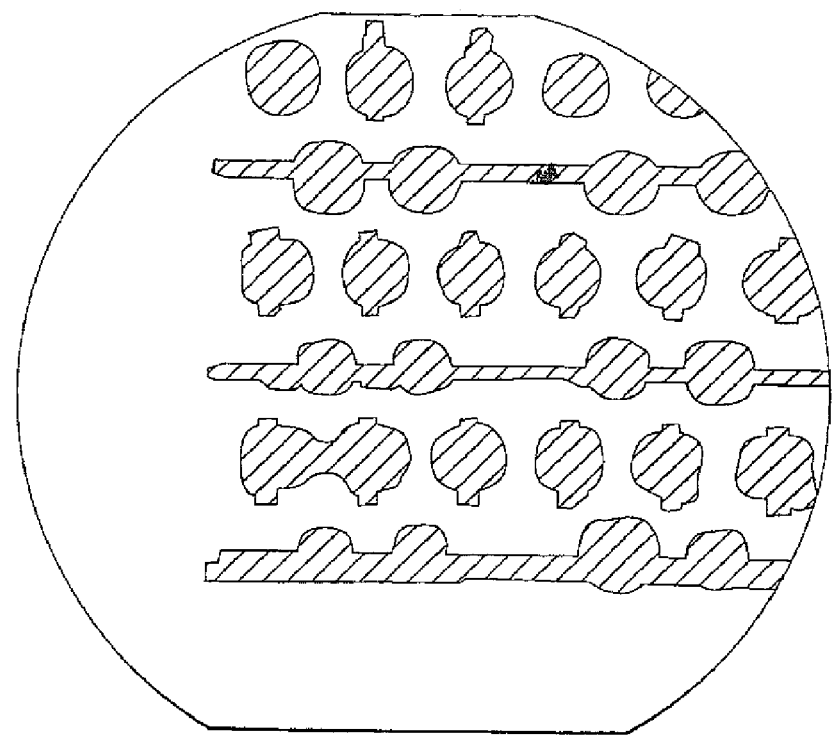
FIGS. 28a and 28b are x-ray photographs showing the product of Example 4 of the method of the present invention.
Figure 28B:
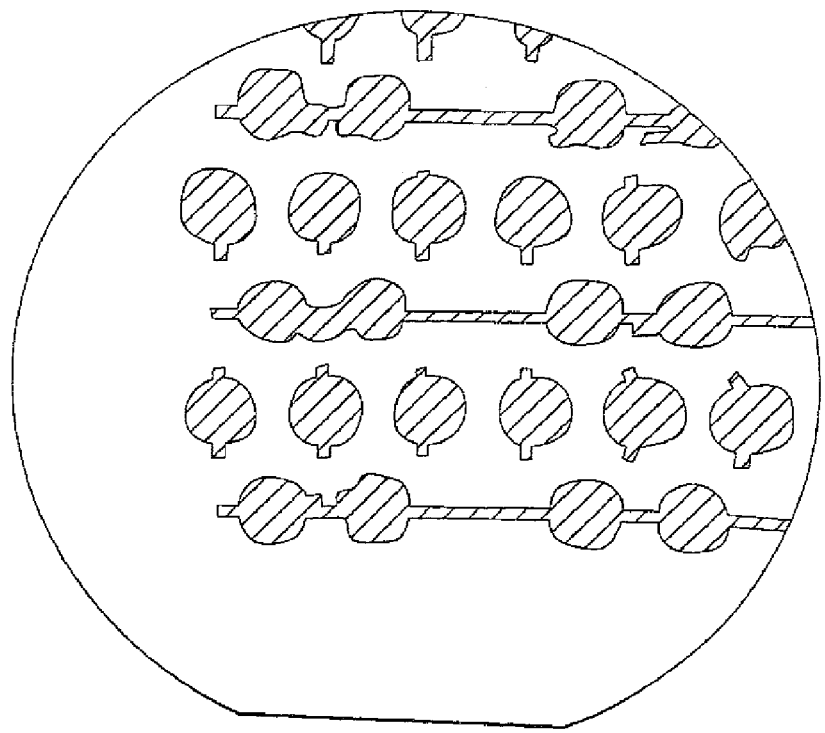
Figure 28C:
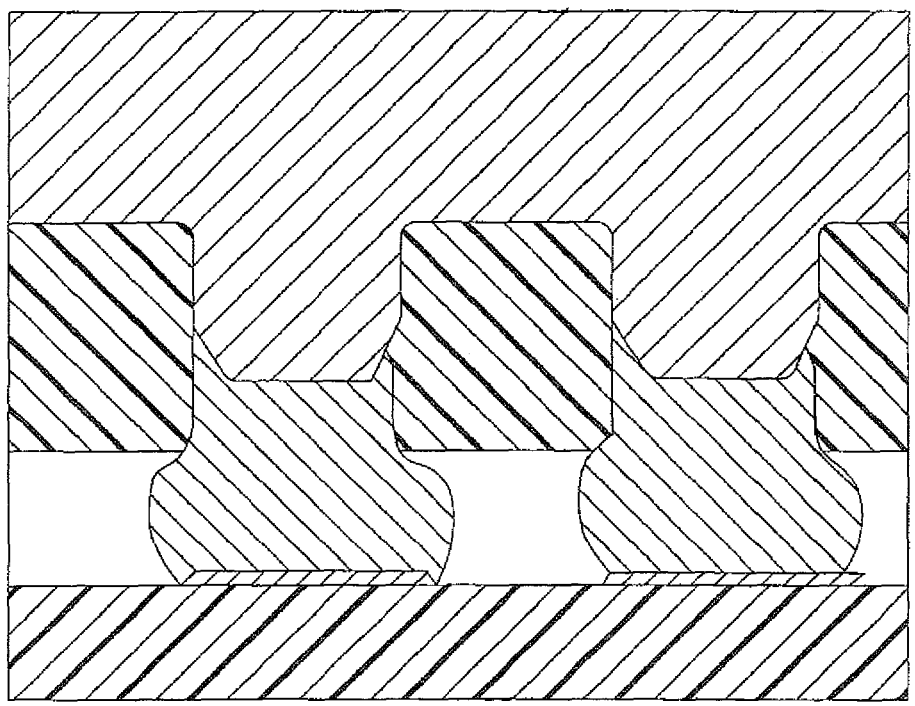
FIGS. 28c and 28d are electron microscope photographs showing the product of Example 4 of the method of the present invention.
Figure 28D:
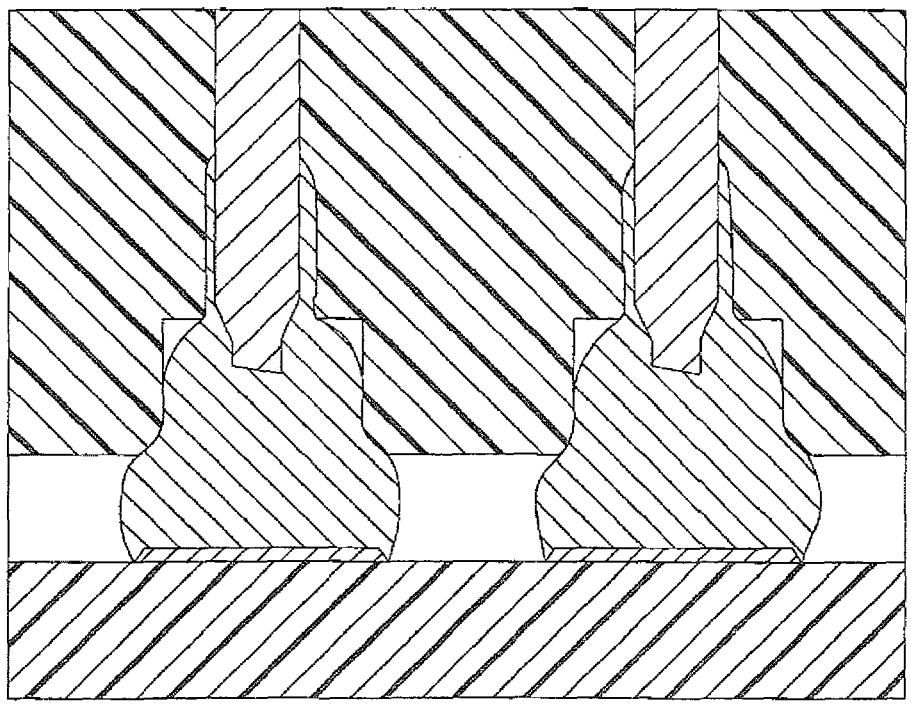

26a and 26b may have been somewhat different. In almost all cases solder balls were satisfactorily fused to the contact leads and solder balls were of an acceptably uniform height above the plane of the exterior surfaces of the plug and receptacle on visual inspection. A stencil with a pattern matching the solder balls on both the plug and receptacle was used to apply solder paste onto conductive solder pads on two different circuit boards having a thickness of 0.061 inches. The plug was positioned on one circuit board and the receptacle was positioned on the other. The plug and receptacle were then separately again treated in the conveyor oven under conditions similar to those described in fusing the solder balls to the contacts except that conveyor speed was decreased to 11 in/sec. After cooling, the plug and receptacle were found to have been satisfactorily fused to their respective boards. A photograph showing these x-rays of selected solder balls are attached respectively at FIGS. 28a and 28b. Cross sectional electron microscope photographs were taken to show the fusing of the solder balls to the signal contact leads and the fusing of the solder balls to the printed circuit board material. These electron microscope photographs are shown respectively at FIGS. 28c and 28d. There was only one short between adjacent signal contacts and good connections were made between the contacts and the solder balls and between the solder balls and the boards at all other points.

It will be appreciated that electrical connector and the method of its manufacture has been described in which the connector that can utilize BGA technologies for mounting on a PWB. Surprisingly and unexpectedly it was also found that there was a relatively high degree of uniformity in the profiles of the solder balls and, in particular, in the weights and/or volume of the solder balls.

While the present invention has been described in connection with the preferred embodiments of the various figures, it is to be understood that other similar embodiments may be used or modifications and additions may be made to the described embodiment for performing the same function of the present invention without deviating therefrom. Further, the arrangements described can be used with respect to components other than connectors, that comprise housings formed of insulative materials which carry elements to be fused onto a PWB or other electrical substrate.

Therefore, the present invention should not be limited to any single embodiment, but rather construed in breadth and scope in accordance with the recitation of the appended claims.

What is claimed is:

1. An electrical connector comprising:
   an insulative housing that defines an electrical contact passageway and an exterior surface adjacent to the electrical contact passageway;
   an electrical contact on the insulative housing, wherein the electrical contact is treated to resist solder wicking so that a solder ball is maintained on the electrical contact during a reflow step used to attach the solder ball onto the electrical contact.

2. The electrical connector as claimed in claim 1, wherein the solder ball has a spherical shape prior to the reflow step.

3. The electrical connector as claimed in claim 2, wherein the solder ball has a spherical shape after the reflow step.

4. The electrical connector as claimed in claim 1, wherein the solder ball has a spherical shape after the reflow step.

\* \* \* \* \*